(12) United States Patent
Shioya et al.

(10) Patent No.: US 7,329,612 B2
(45) Date of Patent: Feb. 12, 2008

(54) SEMICONDUCTOR DEVICE AND PROCESS FOR PRODUCING THE SAME

(75) Inventors: Yoshimi Shioya, Chiba (JP); Yuhko Nishimoto, Chiba (JP); Kazuo Maeda, Chiba (JP)

(73) Assignee: Semiconductor Process Laboratory Co., Ltd., Chiba (JP)

( * ) Notice: Subject to any disclaimer, the term of this patent is extended or adjusted under 35 U.S.C. 154(b) by 52 days.

(21) Appl. No.: 10/530,730

(22) PCT Filed: Oct. 20, 2003

(86) PCT No.: PCT/JP03/13410

§ 371 (c)(1),
(2), (4) Date: Sep. 29, 2005

(87) PCT Pub. No.: WO2004/038782

PCT Pub. Date: May 6, 2004

(65) Prior Publication Data

US 2006/0099725 A1    May 11, 2006

(30) Foreign Application Priority Data

Oct. 24, 2002   (JP)   .............................. 2002-310113
Jan. 17, 2003   (JP)   .............................. 2003-010026

(51) Int. Cl.
*H01L 21/469*   (2006.01)
*H01L 21/31*   (2006.01)

(52) U.S. Cl. ...................... 438/758; 438/780; 438/787; 438/788; 438/789; 438/790

(58) Field of Classification Search ...................... None
See application file for complete search history.

(56) References Cited

U.S. PATENT DOCUMENTS

| 5,314,724 | A  |   | 5/1994  | Tsukune et al. |         |
|-----------|----|---|---------|----------------|---------|
| 6,303,523 | B2 | * | 10/2001 | Cheung et al.  | 438/780 |
| 6,656,837 | B2 | * | 12/2003 | Xu et al.      | 438/676 |
| 2005/0042889 | A1 | * | 2/2005 | Lee et al.    | 438/780 |

FOREIGN PATENT DOCUMENTS

| EP | 1037275     | 2/2000  |
| EP | 1113489     | 12/2000 |
| EP | 1156133     | 5/2001  |
| WO | WO 92/12535 | 12/1991 |

* cited by examiner

*Primary Examiner*—Duy-Vu N Deo
(74) *Attorney, Agent, or Firm*—Bacon & Thomas, PLLC

(57) ABSTRACT

A semiconductor device is manufactured by the steps of generating a film forming gas by setting a flow rate ratio of $H_2O$ to any one of a silicon-contained organic compound having a siloxane bond and a silicon-contained organic compound having a $CH_3$ group to 4 or more and adjusting a gas pressure to 1.5 Torr or more, applying a power to the film forming gas to generate a plasma thereof so as to react it, and thus forming a low-dielectric insulating film (62) on a substrate (61), plasmanizing a process gas containing at least any one of He, Ar, $H_2$ or deuterium, and bringing the low-dielectric insulating film (62) into contact with the plasma of the process gas.

17 Claims, 15 Drawing Sheets

FIG. 3

| formed film indication | 1(2) | 3(4) | 5(6) | 7(8) | 9(10) | 11(12) | 13(14) |
|---|---|---|---|---|---|---|---|
| formed film type | Low-k | Low-k | barrier | barrier | barrier | barrier | barrier |
| $H_2O$ | O | O | O | O | O | O | O |
| silicon-contained organic compound | O | O | O | O | O | O | O |
| $C_xH_y$, $C_xH_yF_z$, $C_xH_yB_z$ | (O) | (O) | (O) | (O) | (O) | (O) | (O) |
| $N_2O$ | | | | O | | | O |
| $NH_3$ | | | | | O | | O |
| $N_2$ | | | | | | O | O |
| plasma process | O | | | | | | |
| annealing process | | O | | | | | |
| surface layer removing process | (O) | (O) | | | | | |
| waterproof process | (O) | (O) | | | | | |

Note 1) "Low-k" in the formed film type column denotes the low-dielectric insulating film, and "barrier" denotes the barrier insulating film.

Note 2) (O) in the $C_xH_y$, $C_xH_yF_z$, and $C_xH_yB_z$ columns represents both cases where $C_xH_y$, $C_xH_yF_z$, or $C_xH_yB_z$ is added and is not added.

Note 3) (O) in the surface layer removing process column and the waterproof process column represent both cases where the concerned process is applied and is not applied.

Note 4) Regarding the barrier insulating film, as the case may be, the plasma process in the plasma process column and annealing process in the annealing process column may be applied. In addition, the waterproof process in the waterproof process column may be applied.

SEMICONDUCTOR DEVICE AND PROCESS FOR PRODUCING THE SAME

CROSS-REFERENCE TO RELATED APPLICATIONS

This application is a National Phase Application (35 USC 371) of PCT/JP2003/013410 and claims priority of Japanese Application No. 2002-310113 filed Oct. 24, 2002 and of Japanese Application No. 2003-010026 filed Jan. 17, 2003.

TECHNICAL FIELD

The present invention relates to a semiconductor device and a method of manufacturing the same and, more particularly, a semiconductor device in which a low-dielectric insulating film or a barrier insulating film is formed to cover Cu wirings and a method of manufacturing the same.

BACKGROUND ART

The higher data transfer rate as well as the higher integration degree and the higher density of the semiconductor integrated circuit device is requested nowadays. For this reason, an insulating film having a low dielectric constant with a small RC delay time (referred to as a "low-dielectric insulating film" hereinafter) is employed.

In case the low-dielectric insulating film is employed as an interlayer insulating film to cover the Cu wiring, it is possible that, because such low-dielectric insulating film is porous, Cu is ready to diffuse and thus reduction in the insulating property is brought about. Therefore, an insulating film for preventing the diffusion of Cu (referred to as a "barrier insulating film" hereinafter) is often employed between the low-dielectric insulating film and the Cu wiring.

The low-dielectric insulating film is formed as a porous film by the plasma CVD method using a film forming gas containing a silicon-contained organic compound and $N_2O$, and then applying the $O_2$ plasma process, or the like. Also, the barrier insulating film is formed by the plasma CVD method using the film forming gas containing the silicon-contained organic compound and $N_2O$. Otherwise, in order to further improve the barrier characteristic of the formed film against the diffusion of Cu, such barrier insulating film is formed by the plasma CVD method using the film forming gas in which $N_2$, $NH_3$, etc. are added to the silicon-contained organic compound and $N_2O$.

DISCLOSURE OF INVENTION

In the low-dielectric insulating film and the barrier insulating film, nitrogen introduced into the film due to the film forming gas containing the nitrogen causes the problem. In the following, the problem caused by the nitrogen will be explained in detail.

Upon forming the via hole or the wiring recess in the low-dielectric insulating film or the barrier insulating film formed by the dual-damascene method using the film forming gas containing the nitrogen, when the chemically amplified photoresist for KrF or ArF to expose a line width of 0.13 µm or less is employed, there is a problem such that patterns intended by the design cannot be formed. According to various investigations, the cause of this phenomenon is estimated such that the nitrogen in the low-dielectric insulating film or the barrier insulating film is discharged to occasion excessively the crosslinking reaction of the resist. In particular, if not only $N_2$, $NH_3$, etc. but also $N_2O$ is employed as constitutive gases of the film forming gas of the low-dielectric insulating film and the barrier insulating film, this phenomenon tends to occur.

It is an object of the present invention to provide a semiconductor device manufacturing method capable of containing no nitrogen in a formed film or suppressing a nitrogen content to such an extent that a crosslinking reaction of the resist is not affected, while maintaining functions of respective films with regard to a film formation of a low-dielectric insulating film or a barrier insulating film, and a semiconductor device manufactured by the method.

The invention set forth in claim 1 is related to a semiconductor device manufacturing method, and it is characterized in comprising the steps of generating a film forming gas by using any one of a silicon-contained organic compound having a siloxane bond and a silicon-contained organic compound having a $CH_3$ group and in addition $H_2O$, and adjusting a flow rate ratio of $H_2O$ to the silicon-contained organic compound to 4 or more and a gas pressure to 1.5 Torr or more; applying a power to the film forming gas to generate a plasma thereof so as to react it, and thus forming a low-dielectric insulating film on a substrate; generating a process gas containing at least any one of He, Ar, $H_2$ or deuterium; generating a plasma by applying a power to the process gas; and bringing the low-dielectric insulating film into contact with the plasma of the process gas.

The invention set forth in claim 2 is related to the semiconductor device manufacturing method according to claim 1, and it is characterized in that the power applied to the film forming gas is a power having a frequency of 1 MHz or more.

The invention set forth in claim 3 is related to the semiconductor device manufacturing method according to any one of claims 1 and 2, and it is characterized in that the power applied to the process gas is a power having a frequency of below 1 MHz.

The invention set forth in claim 4 is related to the semiconductor device manufacturing method according to any one of claims 1 and 2, and it is characterized in that the power applied to the process gas is a power having a frequency of 1 MHz or more.

The invention set forth in claim 5 is related to the semiconductor device manufacturing method according to any one of claims 1 to 4, and it is characterized in that a pressure of the process gas is adjusted to 1.0 Torr or less.

The invention set forth in claim 6 is related to the semiconductor device manufacturing method according to any one of claims 1 to 4, and it is characterized in that a pressure of the process gas is adjusted to 0.5 Torr or less.

The invention set forth in claim 7 is related to the semiconductor device manufacturing method according to any one of claims 1 to 6, and it is characterized in that, in the step of bringing the low-dielectric insulating film into contact with the plasma of the process gas, a temperature of the low-dielectric insulating film is raised up to 375° C. or more.

The invention set forth in claim 8 is related to the semiconductor device manufacturing method according to any one of claims 1 to 7, and it is characterized in that the step of bringing the low-dielectric insulating film into contact with the plasma of the process gas is followed by the further step of removing a surface layer of the low-dielectric insulating film.

The invention set forth in claim 9 is related to the semiconductor device manufacturing method according to claim 8, and it is characterized in that the step of removing the surface layer of the low-dielectric insulating film is followed without bringing the low-dielectric insulating film into contact with an atmosphere by the further subsequent step of increasing a temperature of the low-dielectric insulating film to 375° C. or more at an atmospheric pressure or a low pressure, and then bringing the low-dielectric insulating film into contact with a process gas having a $CH_3$ group.

The invention set forth in claim 10 is related to a semiconductor device manufacturing method, and it is characterized in comprising the steps of generating a film forming gas by using any one of a silicon-contained organic compound having a siloxane bond and a silicon-contained organic compound having a $CH_3$ group and in addition $H_2O$, and setting a flow rate ratio of $H_2O$ to the silicon-contained organic compound to 4 or more and a gas pressure to 1.5 Torr or more; applying a power to the film forming gas to generate a plasma thereof so as to react it, and thus forming a low-dielectric insulating film on a substrate; and annealing the low-dielectric insulating film in an atmosphere of a nitrogen gas or an inert gas at a temperature of 400° C. or more.

The invention set forth in claim 11 is related to the semiconductor device manufacturing method according to claim 10, and it is characterized in that the power applied to the film forming gas is a power having a frequency of 1 MHz or more.

The invention set forth in claim 12 is related to the semiconductor device manufacturing method according to claim 10 or 11, and it is characterized in that the step of annealing the low-dielectric insulating film is followed by the further step of removing a surface layer of the low-dielectric insulating film.

The invention set forth in claim 13 is related to the semiconductor device manufacturing method according to claim 12, and it is characterized in that the step of removing the surface layer of the low-dielectric insulating film is followed without bringing the low-dielectric insulating film into contact with an atmosphere by the further subsequent step of increasing a temperature of the low-dielectric insulating film to 375° C. or more at an atmospheric pressure or a low pressure, and then bringing the low-dielectric insulating film into contact with a process gas having a $CH_3$ group.

The invention set forth in claim 14 is related to the semiconductor device manufacturing method according to any one of claims 9 and 13, and it is characterized in that the process gas having the $CH_3$ group is a methylsilane consisting of any one of monomethylsilane ($SiH_3(CH_3)$), dimethylsilane ($SiH_2(CH_3)_2$), trimethylsilane ($SiH(CH_3)_3$), or tetramethylsilane ($Si(CH_3)_4$), or an alkoxysilane consisting of any one of trimethylmethoxysilane ($Si(CH_3)_3(OCH_3)$), dimethyldimethoxysilane ($Si(CH_3)_2(OCH_3)_2$), or methyltrimethoxysilane (TMS: $Si(CH_3)(OCH_3)_3$).

The invention set forth in claim 15 is related to the semiconductor device manufacturing method according to any one of claims 1 to 14, and it is characterized in that a pressure of the film forming gas is adjusted to 1.75 Torr or more.

The invention set forth in claim 16 is related to the semiconductor device manufacturing method according to any one of claims 1 to 15, and it is characterized in that, in the step of forming the low-dielectric insulating film, a temperature of the substrate is raised up to 25° C. or more but 400° C. or less.

The invention set forth in claim 17 is related to a semiconductor device manufacturing method, and it is characterized in comprising the steps of generating a film forming gas by using any one of a silicon-contained organic compound having a siloxane bond and a silicon-contained organic compound having a $CH_3$ group and in addition $H_2O$, and setting a flow rate ratio of $H_2O$ to the silicon-contained organic compound to 12 or more; increasing a temperature of a substrate up to 200° C. or more but 400° C. or less; and applying a power to the film forming gas to generate a plasma thereof so as to react it, and thus forming a barrier insulating film on the substrate whose temperature is raised.

The invention set forth in claim 18 is related to the semiconductor device manufacturing method according to claim 17, and it is characterized in that, in the step of generating the film forming gas, a pressure of the film forming gas is adjusted to below 1.0 Torr and, in the step of forming the barrier insulating film, a power of a frequency of below 1 MHz is applied to the substrate to bias the substrate and to generate a plasma of the film forming gas by the power of the frequency of below 1 MHz so as to react the plasma, and thus the barrier insulating film is formed.

The invention set forth in claim 19 is related to the semiconductor device manufacturing method according to claim 17, and it is characterized in that, in the step of generating the film forming gas, a pressure of the film forming gas is adjusted to below 1.0 Torr and, in the step of forming the barrier insulating film, a power of a frequency of below 1 MHz is applied to the substrate to bias the substrate while at least the power of the frequency of 1 MHz or more out of the power of the frequency of below 1 MHz or the power of the frequency of 1 MHz or more is applied to the film forming gas, whose pressure is adjusted to 1.0 Torr or more, to generate a plasma thereof so as to react it, and thus the barrier insulating film is formed.

The invention set forth in claim 20 is related to a semiconductor device manufacturing method, and it is characterized in comprising the steps of generating a film forming gas by using any one of a silicon-contained organic compound having a siloxane bond and a silicon-contained organic compound having a $CH_3$ group and in addition $H_2O$, and setting a flow rate ratio of $H_2O$ to the silicon-contained organic compound to 12 or more; adjusting a pressure of the film forming gas to below 1.0 Torr; increasing a temperature of a substrate up to 200° C. or more but 400° C. or less; applying the power of the frequency of below 1 MHz to the substrate to bias the substrate and to generate a plasma of the film forming gas by the power of a frequency of below 1 MHz so as to react the plasma, and thus forming a first insulating film; generating the film forming gas; adjusting a pressure of the film forming gas to 1.0 Torr or more; increasing a temperature of a substrate up to 200° C. or more but 400° C. or less; applying a power of a frequency of below 1 MHz to the substrate to bias the substrate while applying at least the power of the frequency of 1 MHz or more out of the power of the frequency of below 1 MHz or the power of the frequency of 1 MHz or more to the film forming gas, whose pressure is adjusted to 1.0 Torr or more, to generate a plasma thereof so as to react it, and thus forming a second insulating film on the first insulating film, whereby the barrier insulating film composed of the first insulating film and the second insulating film is formed.

The invention set forth in claim 21 is related to the semiconductor device manufacturing method according to any one of claims 17 to 20, and it is characterized in that dinitrogen monoxide ($N_2O$) is added, or nitrogen ($N_2$) or ammonia ($NH_3$) is added, or dinitrogen monoxide ($N_2O$) and ammonia ($NH_3$) are added to the film forming gas.

The invention set forth in claim 22 is related to the semiconductor device manufacturing method according to any one of claims 1 to 21, and it is characterized in that the silicon-contained organic compound having the siloxane bond is any one of hexamethyldisiloxane (HMDSO: $(CH_3)_3Si-O-Si(CH_3)_3$), octamethylcyclotetrahexane (OMCTS)

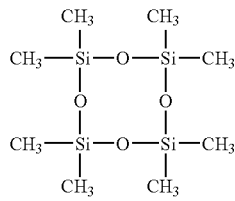

octamethyltrisiloxane (OMTS), or

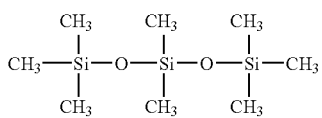

tetramethylcyclotetrasiloxane (TMCTS)

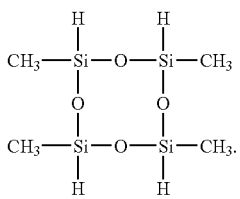

The invention set forth in claim 23 is related to the semiconductor device manufacturing method according to any one of claims 1 to 21, and it is characterized in that the silicon-contained organic compound having the siloxane bond is a compound obtained by replacing at least one $CH_3$ group of any one of hexamethyldisiloxane (HMDSO: $(CH_3)_3Si-O-Si(CH_3)_3$), octamethylcyclotetrahexane (OMCTS)

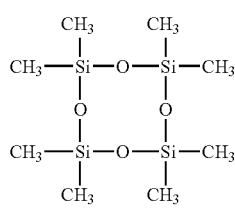

octamethyltrisiloxane (OMTS), or

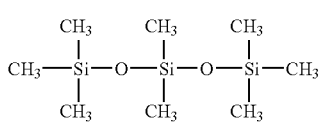

tetramethylcyclotetrasiloxane (TMCTS)

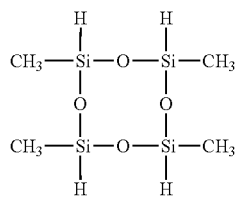

with F.

The invention set forth in claim 24 is related to the semiconductor device manufacturing method according to any one of claims 1 to 23, and it is characterized in that the silicon-contained organic compound having the $CH_3$ group is a methylsilane consisting of any one of monomethylsilane ($SiH_3(CH_3)$), dimethylsilane ($SiH_2(CH_3)_2$), trimethylsilane ($SiH(CH_3)_3$), or tetramethylsilane ($Si(CH_3)_4$), or an alkoxysilane consisting of any one of trimethylmethoxysilane ($Si(CH_3)_3(OCH_3)$), dimethyldimethoxysilane ($Si(CH_3)_2(OCH_3)_2$), or methyltrimethoxysilane (TMS: $Si(CH_3)(OCH_3)_3$).

The invention set forth in claim 25 is related to the semiconductor device manufacturing method according to any one of claims 1 to 24, and it is characterized in that $C_xH_y$ (x, y are a positive integer), $C_xH_yF_z$ or $C_xH_yB_z$ (x, y are 0 (where, except the case x=y=0) or a positive integer, z is a positive integer) is added to the film forming gase.

The invention set forth in claim 26 is related to the semiconductor device manufacturing method according to claim 25, and it is characterized in that $C_xH_y$ is $C_2H_4$.

The invention set forth in claim 27 is related to the semiconductor device manufacturing method according to claim 25, and it is characterized in that $C_xH_yF_z$ is $C_3F_8$, $C_4F_8$ or $CHF_3$.

The invention set forth in claim 28 is related to the semiconductor device manufacturing method according to claim 25, and it is characterized in that $C_xH_yB_z$ is $B_2H_6$.

The invention set forth in claim 29 is related to a semiconductor device manufacturing method, and it is characterized in comprising the steps of forming the low-dielectric insulating film by the semiconductor device manufacturing method set forth in claim 1; and forming the barrier insulating film by the semiconductor device manufacturing method set forth in claim 17 or 20.

The invention set forth in claim 30 is related to a semiconductor device manufacturing method, and it is characterized in comprising the steps of forming the low-dielectric insulating film by the semiconductor device manufacturing method set forth in claim 10; and forming the barrier insulating film by the semiconductor device manufacturing method set forth in claim 17 or 20.

The invention set forth in claim 31 is related to the semiconductor device manufacturing method according to claim 29 or 30, and it is characterized in that the step of forming the low-dielectric insulating film is followed without exposing the low-dielectric insulating film to an atmosphere by the further subsequent step of forming the barrier insulating film.

The invention set forth in claim 32 is related to the semiconductor device manufacturing method according to any one of claims 1 to 31, and it is characterized in that wirings or electrodes consisting mainly of a copper film are formed on the substrate.

The invention set forth in claim 33 is related to a semiconductor device manufactured by the semiconductor device manufacturing method set forth in any one of claims 1 to 32.

Next, advantages achieved based on above configurations of the present invention will be explained hereunder.

According to the present invention, since $H_2O$ is used in place of $N_2O$ as the oxidizing gas, no nitrogen is contained in the formed film. The reason why other oxidizing gas such as $O_2$, or the like not containing the nitrogen is not used but $H_2O$ is used is that the film having the relatively good film quality can be formed. In particular, if the flow rate ratio of $H_2O$ to the silicon-contained organic compound is increased to 4 or more, for example, the film having the further good film quality can be formed.

Meanwhile, if the flow rate ratio of $H_2O$ to the silicon-contained organic compound is increased, the relative dielectric constant (k) tends to increase. In order to suppress such increase, upon forming the low-dielectric insulating film by the plasma CVD method, the plasmanizing frequency of the film forming gas is set high to 1 MHz or more and the gas pressure is set high to 1.5 Torr or more. Preferably, the gas pressure is set high to 1.75 Torr or more. In addition, for the same reason, the substrate temperature is set low to 400° C. or less during the film formation.

In this case, since many C—H, O—H, etc. whose bonding is considered as weak are contained in the formed film, the relative dielectric constant is still high such as 2.6 to 2.7 in contrast to the SOD film (Spin On Dielectrics). Therefore, C—H, O—H, etc. are discharged by applying the plasma process or the annealing process to the formed film after the film formation.

In the plasma process, the process gas containing at least any one of He, Ar, $H_2$ or deuterium is generated, for example. In addition, the gas pressure is adjusted to 1 Torr or less, preferably 0.5 Torr or less, for example. Then, the plasma is generated by applying the power to the process gas. The plasma of the process gas is brought into contact with the low-dielectric insulating film which is heated to 375° C. or more (preferably, in the range of 400 to 450° C.). According to the investigation, the relative dielectric constant of the formed film can be further lowered by employing the plasma which is generated by applying the power to the process gas containing at least any one of He, Ar, $H_2$ or deuterium. In particular, it is more effective to employ the plasma which is generated by applying the power of the frequency of below 1 MHz to the process gas whose gas pressure is adjusted to 1 Torr or less. Furthermore, the reason why the low-dielectric insulating film is heated to 375° C. or more during the process is to discharge sufficiently the moisture and so forth in the film, which cannot be sufficiently discharged by the plasma.

Also, in the annealing process, the low-dielectric insulating film is annealed at the temperature of 400° C. or more in the atmosphere of the nitrogen gas or the inert gas. The reason why the annealing process is carried out in the atmosphere of the nitrogen gas or the inert gas is to prevent oxidation of the film. Also, the reason why the annealing process is carried out at the temperature of 400° C. or more is to discharge sufficiently the moisture and so forth in the film without the plasma.

After the plasma process or the annealing process is completed, the surface of the formed film is densified to have the high density and the high relative dielectric constant. Meanwhile, the inside of the formed film is porous and the hygroscopic property may be high. Therefore, the relative dielectric constant is lowered by removing the surface layer, which has the high relative dielectric constant, of the formed film by the plasma gas such as $NF_3$, or the like. Then, the formed film that may have the high hygroscopic property is followed without being exposed to the atmosphere by being subsequently heated to 375° C. or more in the atmospheric pressure or the low pressure and then being brought into contact with the process gas having a $CH_3$ group, so that the moisture resistance can be improved.

As a result, in the low-dielectric insulating film, while keeping the low relative dielectric constant of 2.4 to 2.5 and the excellent moisture resistance characteristic, no nitrogen can be contained, or the nitrogen content can be suppressed to an extent such that the crosslinking reaction of the resist is not affected.

In addition, the reason why the silicon-contained organic compound having the siloxane bond is used as the composition gas of the film forming gas is as follows. That is, because Si—O—Si has already been contained in the compound, the Si—O bond is introduced into the formed film as it is so that the extra reaction of oxygen can be suppressed and the formed film can be stabilized. Moreover, because the compound obtained by replacing at least one $CH_3$ group of the silicon-contained organic compound having the siloxane bond with F is used, F can be contained in the formed film and thus the lower relative dielectric constant can be achieved.

Also, the reason why the silicon-contained organic compound having the $CH_3$ group is used as the composition gas of the film forming gas is as follows. That is, if many $CH_3$ groups are contained in the formed film, Si is ended by the $CH_3$ group to form a void, and thus the dielectric constant can be lowered.

Also, the film formation is executed by adding $C_xH_y$ (x, y are a positive integer), $C_xH_yF_z$ or $C_xH_yB_z$ (x, y are 0 (where, except the case x=y=0) or a positive integer, z is a positive integer) to the film forming gas of the low-dielectric insulating film. Therefore, upon etching selectively the barrier insulating film in the laminated structure of the low-dielectric insulating film and the barrier insulating film, the etching resistance of the low-dielectric insulating film against the etchant of the barrier insulating film can be assured. In particular, since $C_xH_yF_z$ or $C_xH_yB_z$ is used, the etching resistance can be assured and also the lower dielectric constant can be achieved by including F or B in the formed film.

Also, in the barrier insulating film used together with the low-dielectric insulating film, like the case of the low-dielectric insulating film, any one of the silicon-contained organic compound with the siloxane bond and the silicon-contained organic compound having the $CH_3$ group, and in addition $H_2O$ as the oxidizing gas are used. In this case, the flow rate ratio of $H_2O$ to the silicon-contained organic compound is increased to 12 or more, for example, and the gas pressure is set low such as 1.0 Torr or less. Also, the substrate temperature is set to 200 to 400° C. during the film formation. In this case, the plasmanizing frequency of the film forming gas may be set low to 1 MHz or less, or set high 1 MHz or more. With the above film forming conditions, although the relative dielectric constant becomes slightly higher than the low-dielectric insulating film, the film whose function of preventing the diffusion of Cu is enhanced and whose film quality is improved can be formed. In addition, it is possible to contain no nitrogen in the barrier insulating film.

Also, in the barrier insulating film, a nitrogen-containing gas, e.g., dinitrogen monoxide ($N_2O$), nitrogen ($N_2$), ammonia ($NH_3$), or the like may be added in appropriate combination to the film forming gas so that the nitrogen can be microcontained not to exert an influence upon the crosslinking reaction of the resist. As a result, the function of preventing the diffusion of Cu can be further enhanced.

Also, the film formation is carried out by adding $C_xH_y$ (x, y are a positive integer), $C_xH_yF_z$ or $C_xH_yB_z$ (x, y are 0 (where, except the case x=y=0) or a positive integer, z is a positive integer) to the film forming gas of the barrier insulating film. Therefore, upon etching selectively the low-dielectric insulating film in the laminated structure of the barrier insulating film and the low-dielectric insulating film, the etching resistance of the barrier insulating film against the etchant of the low-dielectric insulating film can be assured.

BRIEF DESCRIPTION OF DRAWINGS

FIG. 3 is a table showing combinations of particularly effective gases as a film forming gas applied to the low-dielectric insulating film and the Cu barrier insulating film used in the semiconductor device manufacturing method as the first embodiment of the present invention.

BEST MODE FOR CARRYING OUT THE INVENTION

Embodiments of the present invention will be explained with reference to the drawings hereinafter.

Figure 1:
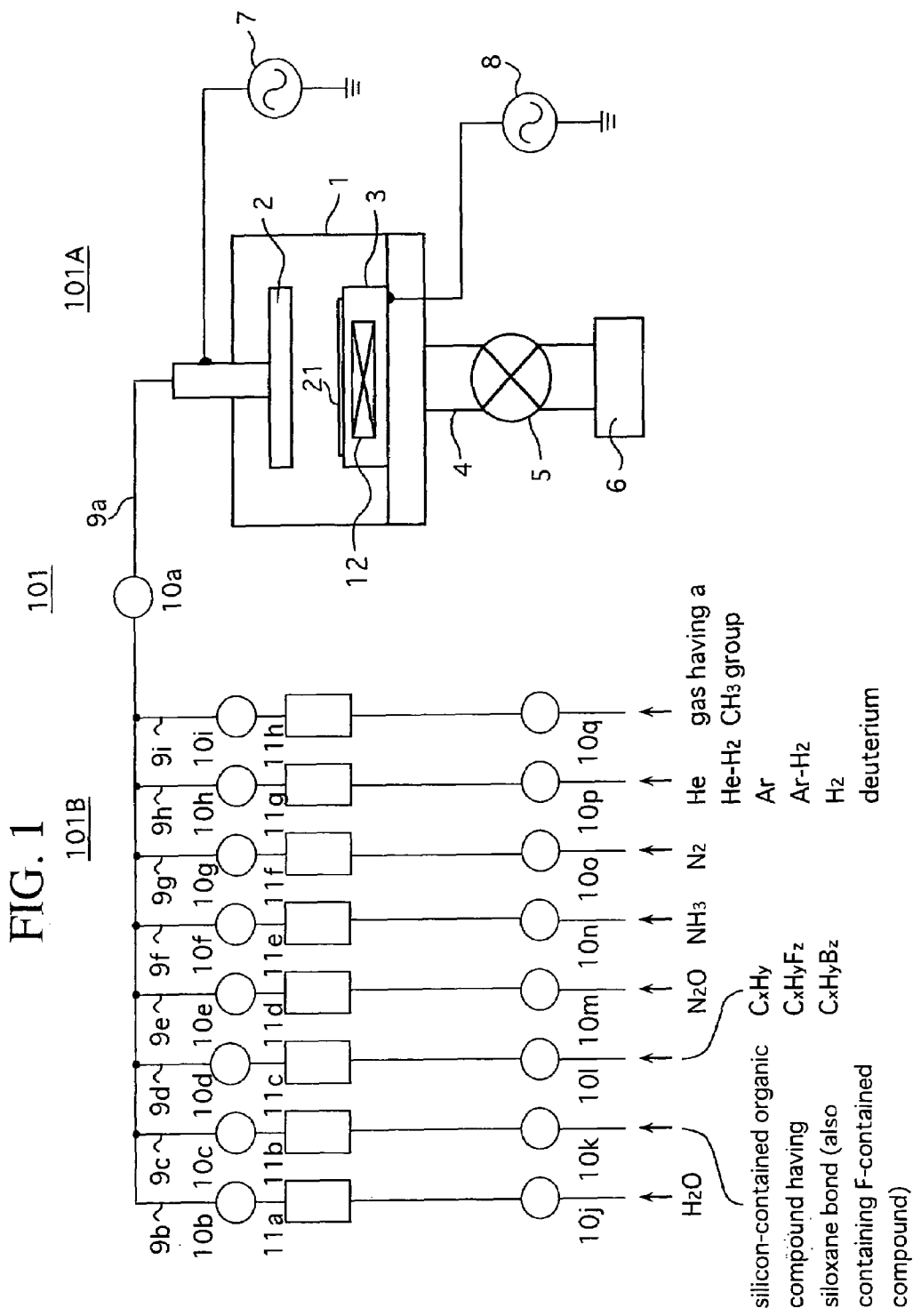
FIG. 1 is a side view showing a configuration of a plasma enhanced CVD equipment used in a semiconductor device manufacturing method as embodiments of the present invention.

Explanation of the Plasma CVD/Processing Equipment Used in a Film Forming Method as an Embodiment of the Present Invention FIG. 1 is a side view showing a configuration of a parallel-plate type plasma CVD/processing equipment 101 used in a semiconductor device manufacturing method as embodiments of the present invention.

This plasma CVD/processing equipment 101 is composed of a film forming/processing portion 101A as a place in which the barrier insulating film or the low-dielectric insulating film is formed on a substrate 21 by a plasma gas and a post-process is applied to a formed film, and a film forming gas/process gas supplying portion 101B having supply sources of a plurality of gases composing a film forming gas and a process gas.

As shown in FIG. 1, the film forming/processing portion 101A has a low pressure chamber 1, and this chamber 1 is connected to an exhaust device 6 via an exhaust piping 4. A switching valve 5 for controlling communication/uncommunication between the chamber 1 and the exhaust device 6 is provided in the middle of the exhaust piping 4. A pressure measuring means such as a vacuum gauge, or the like (not shown) for monitoring a pressure in the chamber 1 is provided to the chamber 1.

A pair of an upper electrode 2 and a lower electrode 3 opposed to each other are provided to the inside of the chamber 1. A high-frequency power supplying power supply (RF power supply) 7 for supplying a high-frequency power of a frequency 13.56 MHz is connected to the upper electrode 2, and a low-frequency power supplying power supply 8 for supplying a low-frequency power of a frequency 380 kHz is connected to the lower electrode 3. The film forming gas, etc. are plasmanized by supplying the high-frequency power ($P_{HF}$) to the upper electrode 2 from at least the high-frequency power supplying power supply 7 of these power supplies 7, 8 or supplying the low-frequency power ($P_{LF}$) to the lower electrode 3 from the low-frequency power supplying power supply 8. The upper electrode 2, the lower electrode 3, and the power supplies 7, 8 constitute a plasma generating means for plasmanizing the film forming gas, etc.

In this case, the low-frequency power of not only the frequency of 380 kHz but also the frequency of more than 100 kHz but below 1 MHz may be applied to the lower electrode 3. Also, the high-frequency power of not only the frequency of 13.56 MHz but also the frequency of 1 MHz or more may be applied to the upper electrode 2 opposed to the lower electrode 3. In addition, in FIG. 1, the high-frequency power supply is connected to the upper electrode 2 and the low-frequency power supply is connected to the lower electrode 3. However, the high-frequency power supply 7 is not limited to the connection with the upper electrode 2 and also the low-frequency power supply 8 is not limited to the connection with the lower electrode 3. Even if the high-frequency power supply 7 is connected to any one of the upper electrode 2 or the lower electrode 3 and the low-frequency power supply 8 is connected to other electrode, the object of this invention can be attained.

The upper electrode 2 also serves as a distributor of the film forming gas, etc. A plurality of through holes are formed in the upper electrode 2, and opening portions of the through holes on an opposing surface to the lower electrode 3 act as discharge ports (introduction ports) of the film forming gas, etc. The discharge ports of the film forming gas, etc. are connected to the film forming gas/process gas supplying portion 101B via a piping 9a. Also, as the case may be, a heater (not shown) may be provided to the upper electrode 2. This is because adhesion of particles made of reaction product by the film forming gas, etc. onto the upper electrode 2 can be prevented by heating the upper electrode 2 at about 100° C. during the film formation.

The lower electrode 3 also serves as a loading table of the substrate 21, and has a heater 12 for heating the substrate 21 loaded on the loading table.

As the supply sources of the film forming gas, a supply source of $H_2O$, a supply source of a silicon-contained organic compound having siloxane bond or a silicon-contained organic compound having a $CH_3$ group, a supply source of $C_xH_y$, $C_xH_yF_z$, or $C_xH_yB_z$, a supply source of dinitrogen monoxide ($N_2O$), a supply source of ammonia ($NH_3$), and a supply source of nitrogen ($N_2$) are provided to the film forming gas/process gas supplying portion 101B. Also, as the supply sources of the process gas, a supply source of He, He—$H_2$, Ar, Ar—$H_2$, $H_2$ or deuterium, a supply source of $NF_3$ (not shown), and a supply source of a process gas having a $CH_3$ group are provided. In this case, the supply source of the silicon-contained organic compound having the $CH_3$ group and the supply source of the process gas having the $CH_3$ group are used commonly, and are represented as the supply source of the gas having the $CH_3$ group in FIG. 1. Also, the supply source of the nitrogen ($N_2$) is used as the supply source of the film forming gas and the supply source of the process gas.

These gases are supplied appropriately to the inside of the chamber 1 of the film forming/processing portion 101A via branch pipings 9b to 9i and the piping 9a to which these branch pipings 9b to 9i are connected. Also, flow rate adjusting means 11a to 11h and switching means 10b to 10q for controlling communication/uncommunication of the branch pipings 9b to 9i are provided in the middle of the branch pipings 9b to 9i. Also, a switching means 10a for closing/opening the piping 9a is provided in the middle of the piping 9a. In this case, although the supply source of $NF_3$ and the piping therefor are not illustrated in FIG. 1, these are constructed in the same way as above other gas piping systems.

According to the above film forming/processing portion 101, the supply source of $H_2O$, the supply source of a silicon-contained organic compound having siloxane bond or a silicon-contained organic compound having a $CH_3$ group, the supply source of $C_xH_y$, $C_xH_yF_z$, or $C_xH_yB_z$, the supply source of dinitrogen monoxide ($N_2O$), the supply source of ammonia ($NH_3$), and the supply source of nitrogen ($N_2$) are provided as the supply sources of the film forming gas. Also, the supply source of He, He—$H_2$, Ar, Ar—$H_2$, $H_2$ or deuterium, the supply source of $NF_3$, and the supply source of a process gas having a $CH_3$ group are provided as the supply sources of the process gas. In addition, plasma generating means 2, 3, 7, 8 for plasmanizing the film forming gas and the process gas are provided.

Accordingly, film formation of the low-dielectric insulating film (Low-k film) made of silicon oxide with a low dielectric constant, plasma process or annealing process explained hereunder and applied after the low-dielectric insulating film is formed, surface layer removing process and waterproof process, and film formation of the Cu barrier insulating film made of a silicon oxide film or a silicon oxide nitride film having a barrier function to prevent the diffusion of Cu can be carried out successively in the same chamber.

Explanation of the Semiconductor Device Manufacturing Method as the First Embodiment of the Present Invention Next, a method of forming the low-dielectric insulating film and the Cu barrier insulating film used in the semiconductor device manufacturing method as the first embodiment of the present invention will be explained hereunder.

Figure 2:
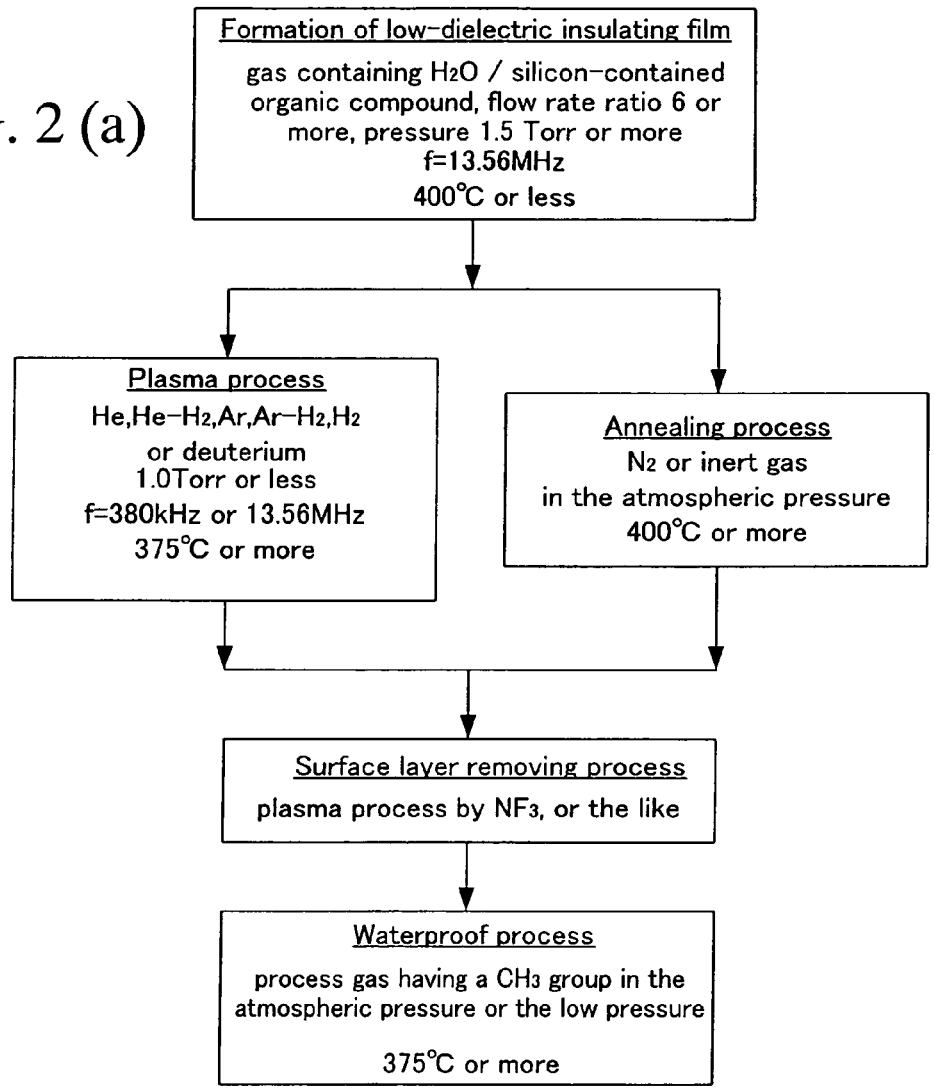
FIG. 2 is a flowchart showing steps of forming a low-dielectric insulating film and a Cu barrier insulating film used in the semiconductor device manufacturing method as a first embodiment of the present invention.
Figure 2:
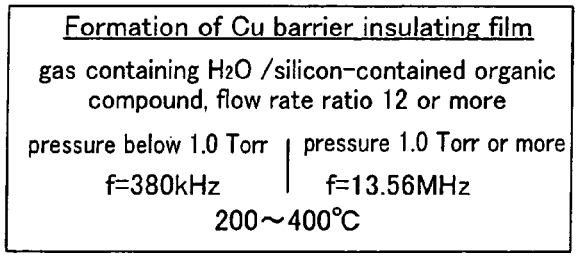

In the low-dielectric insulating film and the Cu barrier insulating film, overall film forming steps in addition to the film forming conditions are different from each other. More particularly, upon forming the low-dielectric insulating film that is excellent in water resistance, has the low dielectric constant, and contains no nitrogen or minor nitrogen, as shown in FIG. 2(a), the film forming step and formed film processing steps after the film formation (plasma process or annealing process and, as the case may be, surface layer removing process, waterproof process) are required. In contrast, upon forming the Cu barrier insulating film that is excellent in Cu diffusion preventing function and contains no nitrogen or minor nitrogen, as shown in FIG. 2(b), basically the film forming step is only required and formed film processing steps after the film formation are not indispensable.

First, combinations of particularly effective gases constituting the respective film forming gases of the low-dielectric insulating film and the Cu barrier insulating film out of the film forming conditions will be explained with reference to FIG. 3 hereunder.

FIG. 3 is a table showing combinations of gases constituting the respective film forming gases applied to form the low-dielectric insulating film (Low-k film) and the Cu barrier insulating film. Particularly effective constitutions of the respective gases will be listed concretely in compliance with the indication of the formed films in FIG. 3 hereunder.

(i) Composition gases of the film forming gas to form the low-dielectric insulating film
  (1), (3) $H_2O$/silicon-contained organic compound having siloxane bond or silicon-contained organic compound having a $CH_3$ group
  (2), (4) $H_2O$/silicon-contained organic compound having siloxane bond or silicon-contained organic compound having a $CH_3$ group/$C_xH_y$, $C_xH_yF_z$, or $C_xH_yB_z$ (ii) Composition gases of the film forming gas to form the Cu barrier insulating film (5) H$_2$O/silicon-contained organic compound having siloxane bond or silicon-contained organic compound having a CH$_3$ group
(6) H$_2$O/silicon-contained organic compound having siloxane bond or silicon-contained organic compound having a CH$_3$ group/C$_x$H$_y$, C$_x$H$_y$F$_z$, or C$_x$H$_y$B$_z$
(7) H$_2$O/silicon-contained organic compound having siloxane bond or silicon-contained organic compound having a CH$_3$ group/N$_2$O
(8) H$_2$O/silicon-contained organic compound having siloxane bond or silicon-contained organic compound having a CH$_3$ group/C$_x$H$_y$, C$_x$H$_y$F$_z$, or C$_x$H$_y$B$_z$/N$_2$O
(9) H$_2$O/silicon-contained organic compound having siloxane bond or silicon-contained organic compound having a CH$_3$ group/NH$_3$
(10) H$_2$O/silicon-contained organic compound having siloxane bond or silicon-contained organic compound having a CH$_3$ group/C$_x$H$_y$, C$_x$H$_y$F$_z$, or C$_x$H$_y$B$_z$/NH$_3$
(11) H$_2$O/silicon-contained organic compound having siloxane bond or silicon-contained organic compound having a CH$_3$ group/N$_2$
(12) H$_2$O/silicon-contained organic compound having siloxane bond or silicon-contained organic compound having a CH$_3$ group/C$_x$H$_y$, C$_x$H$_y$F$_z$, or C$_x$H$_y$B$_z$/N$_2$
(13) H$_2$O/silicon-contained organic compound having siloxane bond or silicon-contained organic compound having a CH$_3$ group/N$_2$O/NH$_3$
(14) H$_2$O/silicon-contained organic compound having siloxane bond or silicon-contained organic compound having a CH$_3$ group/C$_x$H$_y$, C$_x$H$_y$F$_z$, or C$_x$H$_y$B$_z$/N$_2$O/NH$_3$ Next, the film forming conditions other than the above and overall steps of the film formation will be explained and also reasons for employing the film forming conditions containing the above and overall steps of the film formation or their effects will be explained hereunder.

In order to contain no nitrogen in the formed film, H$_2$O is used as an oxidizing gas in place of N$_2$O upon forming the low-dielectric insulating film. The reason why other oxidizing gas such as O$_2$ not containing the nitrogen is not used but H$_2$O is used is that the film with relatively good film quality can be formed. In particular, if a flow rate of H$_2$O to the silicon-contained organic compound is enhanced to 4 or more, for example, the film with better film quality can be formed.

In contrast, if a flow rate of H$_2$O to the silicon-contained organic compound is enhanced, a relative dielectric constant (k) also tends to increase higher. In order to suppress such tendency, in forming the low-dielectric insulating film by the plasma CVD method, a plasmanizing frequency of the film forming gas is set high to 1 MHz or more and a gas pressure is set high to 1.5 Torr ore more, preferably 1.75 Torr ore more. Also, according to the same reason, a substrate temperature is set low to 400° C. or less during the film formation.

In this case, since many C—H, etc. that are supposed to have weak bonding strength are contained in the formed film, a relative dielectric constant of 2.6 to 2.7 is still higher than a SOD (Spin On Dielectrics) film. Therefore, C—H, etc. are discharged by applying the plasma process or the annealing process to the formed film after the film formation, so that the relative dielectric constant is further lowered.

In the plasma process, the process gas is produced by preparing a gas containing at least any one of He, Ar, H$_2$ or deuterium and setting a gas pressure to 1.0 Torr or less, preferably 0.5 Torr or less, for example. Then, the gases are plasmanized by applying a power to the process gas. A temperature of the low-dielectric insulating film is raised up to 375° C. or more, preferably a range of 400° C. to 450° C., and the low-dielectric insulating film is brought into contact with the plasma of the first process gas. According to the investigation, if the plasma generated by applying a power, preferably a power of a frequency of 1 MHz or more, to the first process gas which contains at least any one of He, Ar, H$_2$ or deuterium and whose gas pressure is adjusted to 1 Torr or more is employed, the relative dielectric constant of the formed film can be lowered much more. In this case, the reason why the temperature of the low-dielectric insulating film is raised up to 375° C. or more is to discharge sufficiently the moisture, and the like, which cannot be discharged sufficiently by the plasma, in the formed film.

Also, in the annealing process, the low-dielectric insulating film is heated at the temperature of 400° C. or more in the atmosphere consisting of a nitrogen gas or an inert gas (Ar, He, or the like). It is the reason for carrying out the annealing process in the atmosphere consisting of the nitrogen gas or the inert gas that oxidation of the low-dielectric insulating film can be prevented. Also, It is the reason for carrying out the annealing process at the temperature of 400° C. or more that the moisture, and so on in the formed film can be sufficiently discharged not to use the plasma.

After the plasma process or the annealing process is finished, a surface layer of the formed film is densified to have a high density and has a high relative dielectric constant. According to the investigation, the density of the surface layer of the formed film was 2.2 g/cm3 and the refractive index was about 1.6. In contrast, an inside of the formed film is porous and thus there is a possibility to have high hygroscopic property. Therefore, the surface layer of the formed film whose relative dielectric constant is high is removed by means of the plasma gas such as NF$_3$, or the like to lower the relative dielectric constant of the formed film. Then, the formed film whose hygroscopic property may be high is maintained not to be exposed to the atmosphere and subsequently is brought into contact with the process gas which has a CH$_3$ group at the temperature raised to 375° C. or more and at an atmospheric pressure or a reduced pressure. Thus, a moisture resistance of the formed film is improved. More concretely, the process is applied for about 1 minute or more under the condition of 50 sccm or more in a flow rate of the process gas having a CH$_3$ group, e.g., HMDSO, and 1 Torr or more in a gas pressure.

As a result, the low-dielectric insulating film can maintain the low relative dielectric constant such as 2.4 to 2.5 and the excellent moisture resistance characteristic, and the nitrogen therein can be removed or the nitrogen content therein can be suppressed to such an extent that the crosslinking reaction of the resist is not affected.

In addition, as the composition gas of the film forming gas, the silicon-contained organic compound with the siloxane bond is used. This is because, since Si—O—Si has already been contained in the compound, the Si—O bond may be introduced into the formed film as it is and therefore the extra reaction of oxygen may be suppressed, and because the formed film may be stabilized. In addition, the silicon-contained organic compound with the siloxane bond, in which at least one CH$_3$ group is replaced with F, may be used. This is because the lower dielectric constant can be achieved by introducing F into the formed film.

Also, C$_x$H$_y$ (x, y are a positive integer), C$_x$H$_y$F$_z$ or C$_x$H$_y$B$_z$ (x, y are 0 (where, except the case x=y=0) or a positive integer, z is a positive integer) may be added to the film forming gas of the low-dielectric insulating film. With this, upon etching selectively the Cu barrier insulating film in the laminated structure of the low-dielectric insulating film and the Cu barrier insulating film, the etching resistance of the low-dielectric insulating film against the etchant of the Cu barrier insulating film can be assured. In particular, if $C_xH_yF_z$ or $C_xH_yB_z$ is used, the etching resistance can be assured and also the lower dielectric constant can be achieved by including F or B in the formed film.

In the Cu barrier insulating film used together with the low-dielectric insulating film, like the case of the low-dielectric insulating film, the silicon-contained organic compound with the siloxane bond and $H_2O$ as the oxidizing gas are used. Unlike the case of the low-dielectric insulating film, a flow rate ratio of $H_2O$ to the silicon-contained organic compound is increased to 12 or more, for example. In this case, a gas pressure is set low such as below 1.0 Torr when a plasmanizing frequency of the applied power is below 1 MHz. In contrast, a gas pressure is set high such as 1.0 Torr or more when the plasmanizing frequency is 1 MHz or more and a bias power with frequency of below 1 MHz is applied. Also, the substrate temperature is set to 200 to 400° C. during the film formation. With the above film forming conditions, although the relative dielectric constant becomes slightly higher, the film whose function of preventing the diffusion of Cu is enhanced and whose film quality is improved can be formed. In addition, it is possible to contain no nitrogen in the Cu barrier insulating film.

Alternatively, in the Cu barrier insulating film, a nitrogen-containing gas, e.g., dinitrogen monoxide ($N_2O$), nitrogen ($N_2$), ammonia ($NH_3$), or the like may be microadded appropriately to the film forming gas in combination such that the nitrogen should be contained not to exert an influence upon the crosslinking reaction of the resist. As a result, the function of preventing the diffusion of Cu can be further enhanced.

Also, $C_xH_y$ (x, y are a positive integer), $C_xH_yF_z$ or $C_xH_yB_z$ (x, y are 0 (where, except the case x=y=0) or a positive integer, z is a positive integer) may be added to the film forming gas of the Cu barrier insulating film. Accordingly, upon etching selectively the low-dielectric insulating film in the laminated structure of the Cu barrier insulating film and the low-dielectric insulating film, the etching resistance of the Cu barrier insulating film against the etchant of the low-dielectric insulating film can be assured.

In this case, in case the Cu barrier insulating film is formed thereon subsequently after the low-dielectric insulating film is formed, it is preferable that the waterproof process should be applied in the atmospheric pressure or the low pressure and subsequently the Cu barrier insulating film should be formed not to expose to the atmosphere. This is because it should be prevented that the low-dielectric insulating film absorbs the moisture in the atmosphere to increase the relative dielectric constant.

Next, with regard to the silicon-contained organic compound with the siloxane bond or the silicon-contained organic compound having a $CH_3$ group, $C_xH_y$, $C_xH_yF_z$ or $C_xH_yB_z$, as the film forming gas used in the present invention, and the process gas having a $CH_3$ group used as the processes after the film formation, an explanation will be carried out hereunder.

As the typical examples, compounds described in the following may be employed.

(i) Silicon-contained organic compound with the siloxane bond
 (a) Compound not containing F
  hexamethyldisiloxane (HMDSO: $(CH_3)_3Si-O-Si(CH_3)_3$),
  octamethylcyclotetrahexane (OMCTS)

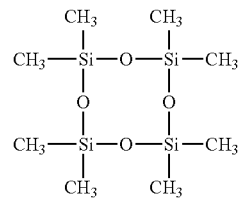

octamethyltrisiloxane (OMTS)

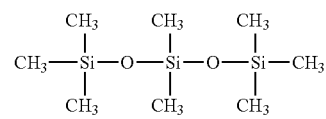

tetramethylcyclotetrasiloxane (TMCTS)

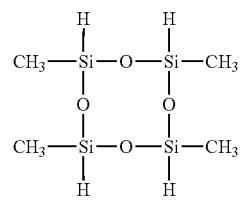

(b) Compound containing F
  The compound in which at least one methyl group ($CH_3$) is replaced with F in the above compounds.
(ii) $C_xH_y$, $C_xH_yF_z$ or $C_xH_yB_z$
 (a) $C_xH_y$
  $C_2H_4$
 (b) $C_xH_yF_z$
  $C_3F_8$
  $C_4F_8$
  $CHF_3$
 (c) $C_xH_yB_z$
  $B_2H_6$
(iii) Silicon-contained organic compound having a $CH_3$ group and Process gas having a $CH_3$ group
 (a) Silicon-contained organic compound in the above (i)
 (b) methylsilane ($SiH_n(CH_3)_{4-n}$: n=0 to 3)
  monomethylsilane ($SiH_3(CH_3)$)
  dimethylsilane ($SiH_2(CH_3)_2$)
  trimethylsilane ($SiH(CH_3)_3$)
  tetramethylsilane ($Si(CH_3)_4$)
 (c) Compound having alkoxy bond
  dimethyldimethoxysilane ($Si(CH_3)_2(OCH_3)_2$)
  dimethyldiethoxysilane ($Si(CH_3)_2(OC_2H_5)_2$)
  methyltrimethoxysilane (TMS: $SiH(OCH_3)_3$)

Next, with regard to results of investigations of a relative dielectric constant, a refractive index, and a leakage current density of the silicon-contained insulating film formed by the film forming method of the present invention using the above plasma CVD equipment, an explanation will be carried out hereunder.

(1) FIRST EXAMPLE

An insulating film in First Example is an example of the low-dielectric insulating film. As the sample, a silicon oxide film as the low-dielectric insulating film was formed on the substrate on which copper wirings were formed. The silicon oxide film was formed by the plasma CVD method under following film forming conditions. A $H_2O$ gas flow rate was changed to investgate a $H_2O$ gas flow rate dependency.

The pre-process was carried out prior to the formation of the silicon oxide film to remove a surface oxide film on the copper wirings. In the processing method, the parallel-plate type plasma-enhanced CVD equipment was employed, a gas pressure was adjusted to 1 Torr by introducing $NH_3$ at a flow rate of 500 sccm, then $NH_3$ was plasmanized by applying a power of about 100 W at a frequency of 13.56 MHz for 10 second, and then the substrate that was heated up to 375° C. was brought into contact with the plasma.

Figure 4:
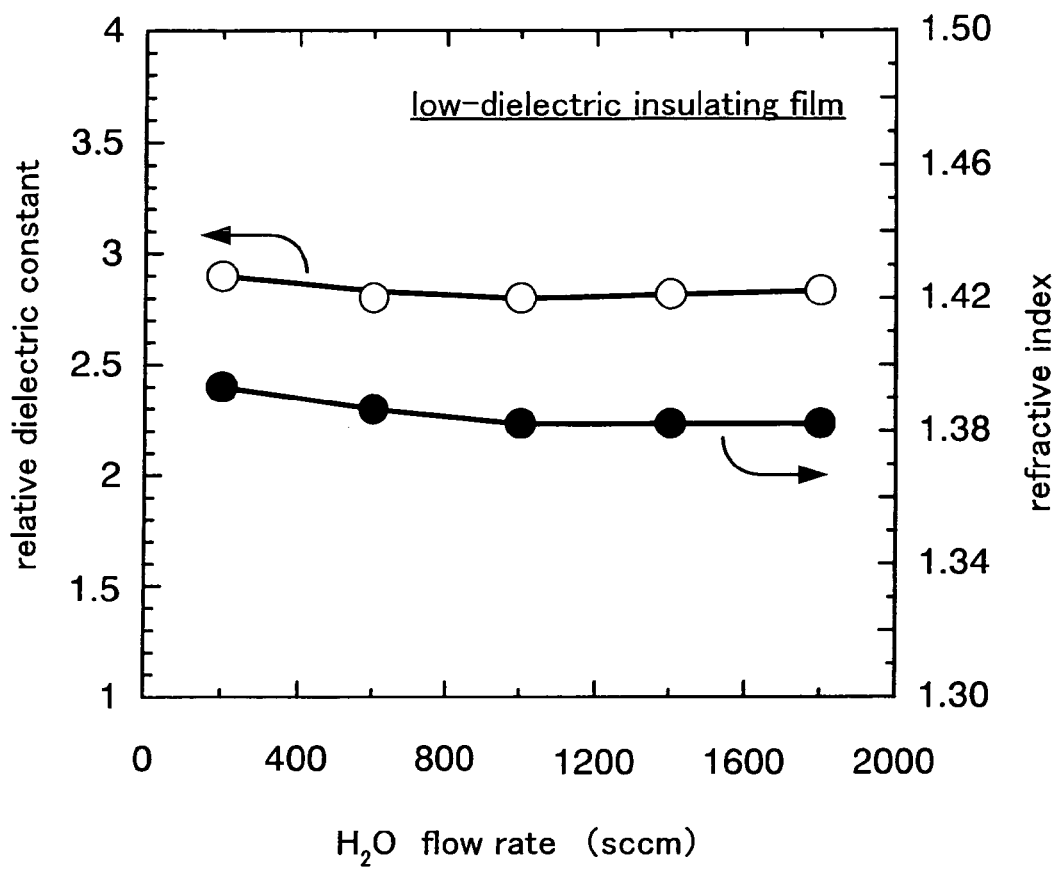
FIG. 4 is a graph showing a $H_2O$ dependency of a relative dielectric constant and a refractive index, in a silicon oxide film formed under film forming conditions I in First Example according to the semiconductor device manufacturing method as the first embodiment of the present invention.

(Film forming conditions I)
  (i) Film forming gas conditions
    HMDSO gas flow rate: 50 sccm
    $H_2O$ gas flow rate: 200 to 1800 sccm
    gas pressure: 1.75 Torr
  (ii) Plasmanizing conditions
    high-frequency power (13.56 MHz) $P_{HF}$: 300 W
    low-frequency power (380 kHz) $P_{LF}$: 0 W
  (iii) Substrate heating temperature: 375° C.
  (iV) Formed silicon oxide film
    film thickness: 700 nm Investigated results of the $H_2O$ gas flow rate dependency of the relative dielectric constant (k(1 MHz)) and the refractive index of the formed film immediately after the film formation, in the silicon oxide film are shown in FIG. 4. An ordinate on the left side of FIG. 4 denotes the relative dielectric constant represented in a linear scale, and an ordinate on the right side denotes the refractive index represented in a linear scale. Similarly, an abscissa of FIG. 4 denotes a $H_2O$ gas flow rate (sccm).

A DC voltage was applied to the silicon oxide film, then a capacitance was measured by a C-V measuring method in which a signal having a frequency of 1 MHz is superposed onto the DC voltage, and then the relative dielectric constant (k(1 MHz)) was calculated based on the capacitance value. Also, the refractive index was measured by the ellipsometer using a He—Ne laser of 6328 angstrom. The introducing ways of items in the following Examples are similar to these introducing ways thereof.

In this case, the reason why the refractive index is measured is that magnitudes of the ionic polarization and the orientation polarization due to C—H, O—H, etc. can be evaluated, as described in the following. Since the refractive index is measured by a light having a high frequency, it is possible to know a magnitude ke (represented as a square of the refractive index n) of the electronic polarization except the ionic polarization and the orientation polarization. Therefore, a magnitude of ki (ionic polarization)+ko (orientation polarization) can be derived based on the equation of k(1 MHz)=ke(electronic polarization)+ki(ionic polarization)+ko(orientation polarization) using the above relative dielectric constant (k(1 MHz)) and the electronic polarization. In addition, since the ionic polarization ki can be calculated based on K-K transformation (Kramers-Kronig transformation) using FT-IR data, a magnitude of only the orientation polarization ko can be derived.

According to FIG. 4, the considerably low relative dielectric constant such as about 2.9 was obtained immediately after the film formation. A dependency of the relative dielectric constant upon the $H_2O$ gas flow rate was small and the relative dielectric constant was seldom changed in the $H_2O$ gas flow rate range of 200 to 1800 sccm. The investigated range of the $H_2O$ gas flow rate in excess of 200 sccm is used as the ground that the flow rate ratio of the $H_2O$ gas to the silicon-contained organic compound in the film forming gas of the low-dielectric insulating film should be set to 4 or more.

In this case, the refractive index had a small dependency of about 1.38 to 1.39 upon the $H_2O$ gas flow rate, and a difference between the relative dielectric constant and squares (about 1.9) of the refractive index was in excess of 1 and was relatively large.

(2) SECOND EXAMPLE

An insulating film in Second Example is another example of the low-dielectric insulating film. As a sample, the silicon oxide film as the low-dielectric insulating film was formed on the same substrate as First Example. This silicon oxide film was formed under following film forming conditions by the plasma CVD method. In order to investigate a $C_4F_8$ gas flow rate dependency, a $C_4F_8$ gas flow rate was changed. In Second Example, in order to remove the surface oxide film on the copper wirings, the pre-process was carried out under the same conditions as First Example prior to the film formation of the silicon oxide film.

Figure 5:
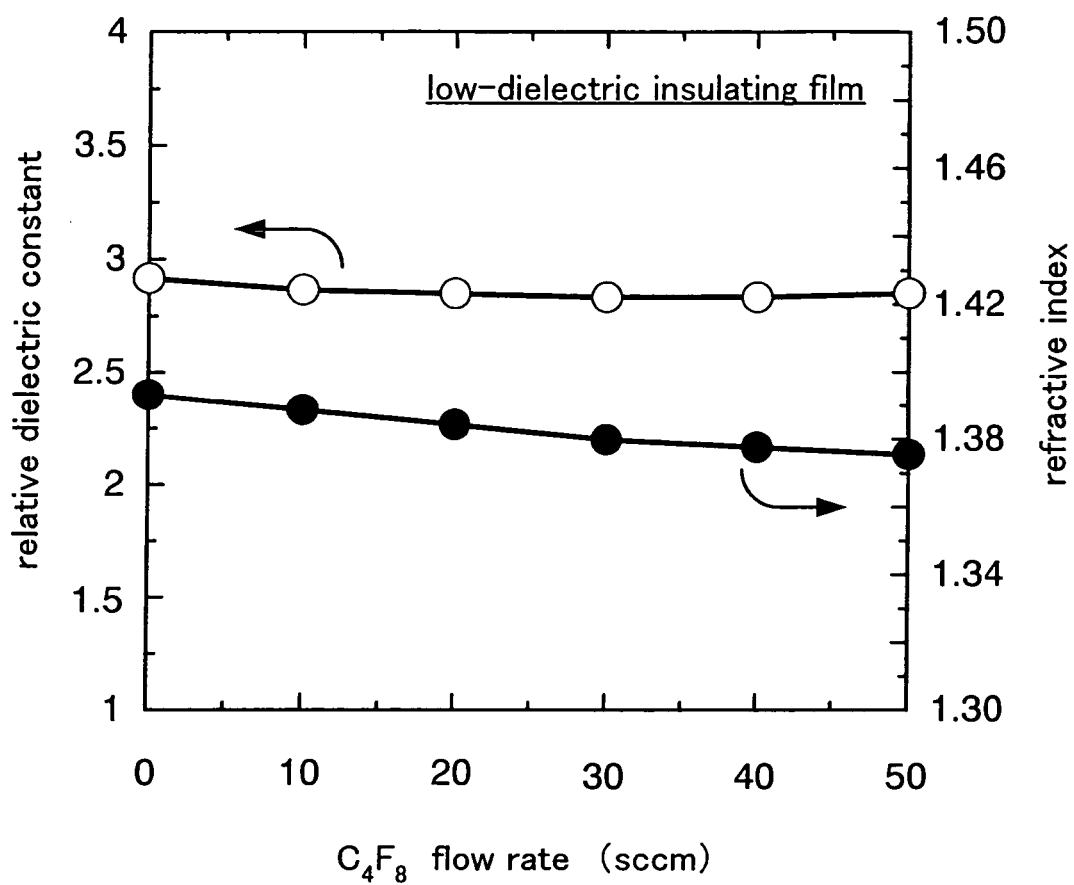
FIG. 5 is a graph showing a $C_4F_8$ dependency of the relative dielectric constant and the refractive index, in the silicon oxide film formed under film forming conditions II in Second Example according to the semiconductor device manufacturing method as the first embodiment of the present invention.

(Film forming conditions II)
  (i) Film forming gas conditions
    HMDSO gas flow rate: 50 sccm
    $H_2O$ gas flow rate: 1000 sccm
    $C_4F_8$ gas flow rate: 0 to 50 sccm
    gas pressure: 1.5 Torr
  (ii) Plasmanizing conditions
    high-frequency power (13.56 MHz) $P_{HF}$: 300 W
    low-frequency power (380 kHz) $P_{LF}$: 0 W
  (iii) Substrate heating temperature: 375° C.
  (iV) Formed silicon oxide film
    film thickness: 500 nm With regard to the silicon oxide film, investigated results of the $C_4F_8$ gas flow rate dependency of the relative dielectric constant (k) and the refractive index as the formed film immediately after the film formation are shown in FIG. 5. An ordinate on the left side of FIG. 5 denotes the relative dielectric constant represented in a linear scale, and an ordinate on the right side denotes the refractive index represented in a linear scale. Similarly, an abscissa of FIG. 5 denotes a $C_4F_8$ gas flow rate (sccm).

According to FIG. 5, a $C_4F_8$ gas was added to the film forming gas in First Example, nevertheless the relative dielectric constant was substantially identical to First Example and was almost 2.9. A dependency of the relative dielectric constant upon the $C_4F_8$ gas flow rate was small and the relative dielectric constant was seldom changed in the $C_4F_8$ gas flow rate range of 0 to 50 sccm.

In this case, the refractive index of 1.37 to 1.39 was obtained. A difference between the relative dielectric constant and squares of the refractive index was in the same extent as First Example, and was relatively large.

(3) THIRD EXAMPLE

An insulating film in Third Example is still another example of the low-dielectric insulating film. Here, an investigation is performed for variation in characteristics (the relative dielectric constant, the refractive index) before and after the plasma process after the film formation. As a sample, the silicon oxide film as the low-dielectric insulating film was formed on the same substrate as First Example. This silicon oxide film was formed under following film forming conditions by the plasma CVD method. In order to investigate a $H_2O$ gas flow rate dependency, a $H_2O$ gas flow rate was changed. In Third Example, in order to remove the surface oxide film on the copper wirings, the pre-process was carried out under the same conditions as First Example prior to the film formation of the silicon oxide film.

(Film forming conditions III)
(i) Film forming gas conditions
  HMDSO gas flow rate: 50 sccm
  $H_2O$ gas flow rate: 200 to 1400 sccm
  gas pressure: 2.0 Torr
(ii) Plasmanizing conditions
  high-frequency power (13.56 MHz) $P_{HF}$: 300 W
  low-frequency power (380 kHz) $P_{LF}$: 0 W
(iii) Substrate heating temperature: 200° C.
(iV) Formed silicon oxide film
  film thickness: 700 nm
(Plasma process conditions I)
(i) Atmosphere
  gas: gas obtained by mixing $H_2$ of 3% into He (represented as He—$H_2$ (3%))
  gas pressure: 0.5 Torr
(ii) Plasmanizing conditions
  $P_{HF}$: 400 W
(iii) Substrate heating temperature: 375° C.
(iV) Process time: 2 minutes FIG. 6, with regard to the silicon oxide film formed under above film forming conditions III, is a graph showing investigated results of the variation in the characteristics (the relative dielectric constant, the refractive index) before and after the plasma process applied under the plasma process conditions I.

Figure 6:
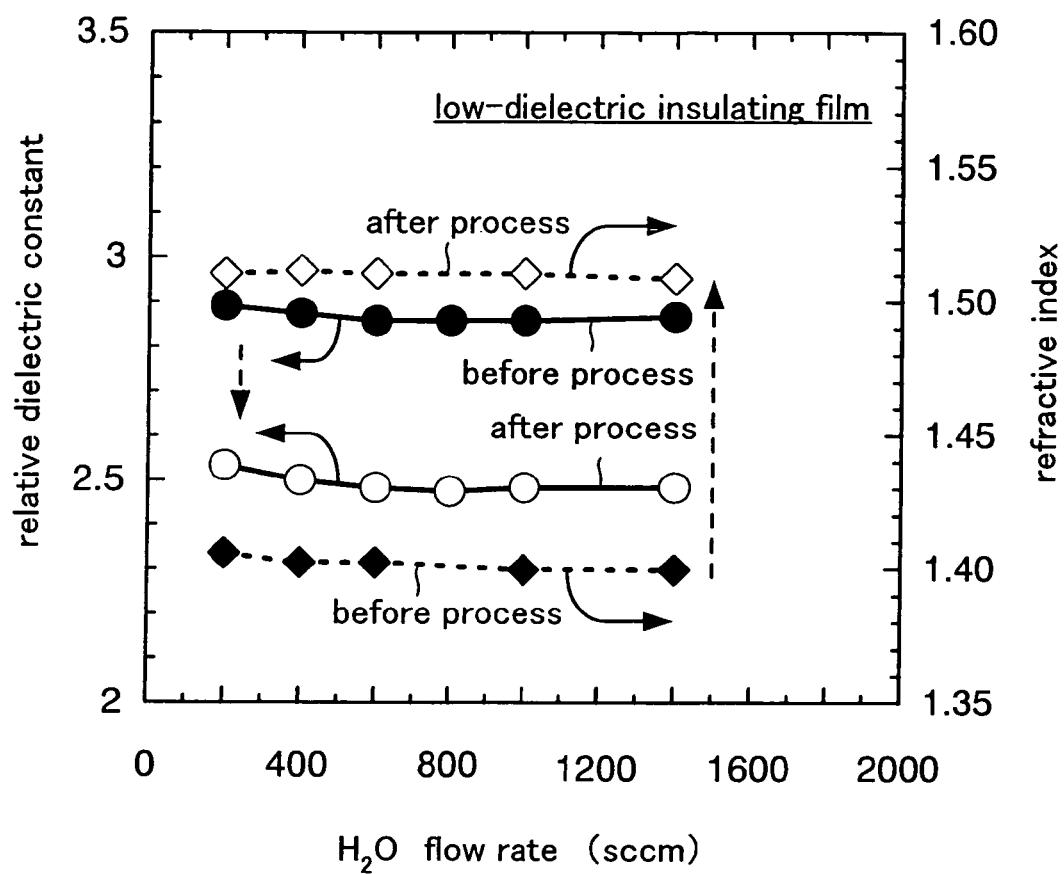
FIG. 6 is a graph showing a $H_2O$ dependency of the relative dielectric constant and the refractive index before and after the plasma process applied after the film formation, in the silicon oxide film formed under film forming conditions III in Third Example according to the semiconductor device manufacturing method as the first embodiment of the present invention.

An ordinate on the left side of FIG. 6 denotes the relative dielectric constant represented in a linear scale, and an ordinate on the right side denotes the refractive index represented in a linear scale. Similarly, an abscissa of FIG. 6 denotes a $H_2O$ gas flow rate (sccm). In FIG. 6, a ● mark shows the relative dielectric constant of the formed film before the plasma process, and a ○ mark shows the relative dielectric constant of the formed film after the plasma process. Also, a ♦ mark shows the refractive index of the formed film before the plasma process, and a ◇ mark shows the refractive index of the formed film after the plasma process.

According to FIG. 6, the relative dielectric constant that was almost 2.9 immediately after the film formation was lowered to almost 2.47 after the plasma process. In this case, a dependency of the relative dielectric constant upon a $H_2O$ gas flow rate was small, and the relative dielectric constant was seldom changed in the $H_2O$ gas flow rate range of 200 to 1400 sccm. In this manner, the effect of reducing the relative dielectric constant by the plasma process was remarkable.

In contrast, the refractive index that was almost 1.4 immediately after the film formation was increased to almost 1.51 after the plasma process. Also, a dependency of the refractive index upon a $H_2O$ gas flow rate was small. Therefore, a difference between the relative dielectric constant and squares (about 2.3) of the refractive index was reduced by the plasma process. According to this result, it was confirmed that, although the electronic polarization is slightly increased, the ionic polarization and the orientation polarization due to C—H and O—H, bonding of which is considered as weak, are reduced to cover such increase sufficiently. That is, it was confirmed that C—H and O—H are removed from the formed film by the plasma process and thus the relative dielectric constant is lowered.

(4) FOURTH EXAMPLE

Figure 11:
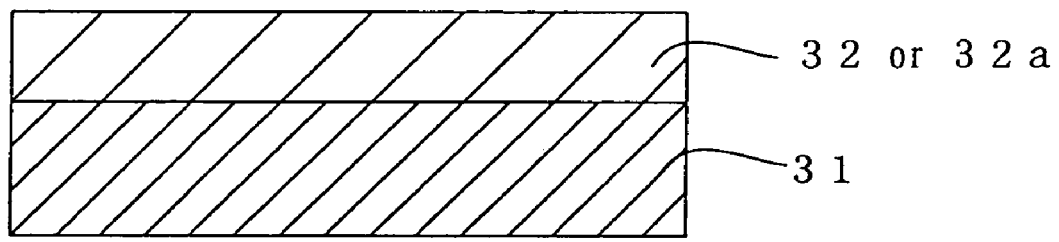
FIG. 11 is a sectional view showing a structure of a sample used in Fourth and Fifth Examples according to the semiconductor device manufacturing method as the first embodiment of the present invention.

An insulating film in Fourth Example is an example of the Cu barrier insulating film. As a sample, as shown in FIG. 11, a silicon oxide film 32 as the Cu barrier insulating film was formed on a copper film 31. This silicon oxide film 32 was formed by the plasma CVD method under following film forming conditions. In order to investigate a $H_2O$ gas flow rate dependency, a $H_2O$ gas flow rate was changed. In Fourth Example, in order to remove the surface oxide film, the pre-process of the copper wirings was carried out under the same conditions as First Example prior to the film formation of the silicon oxide film.

Figure 7:
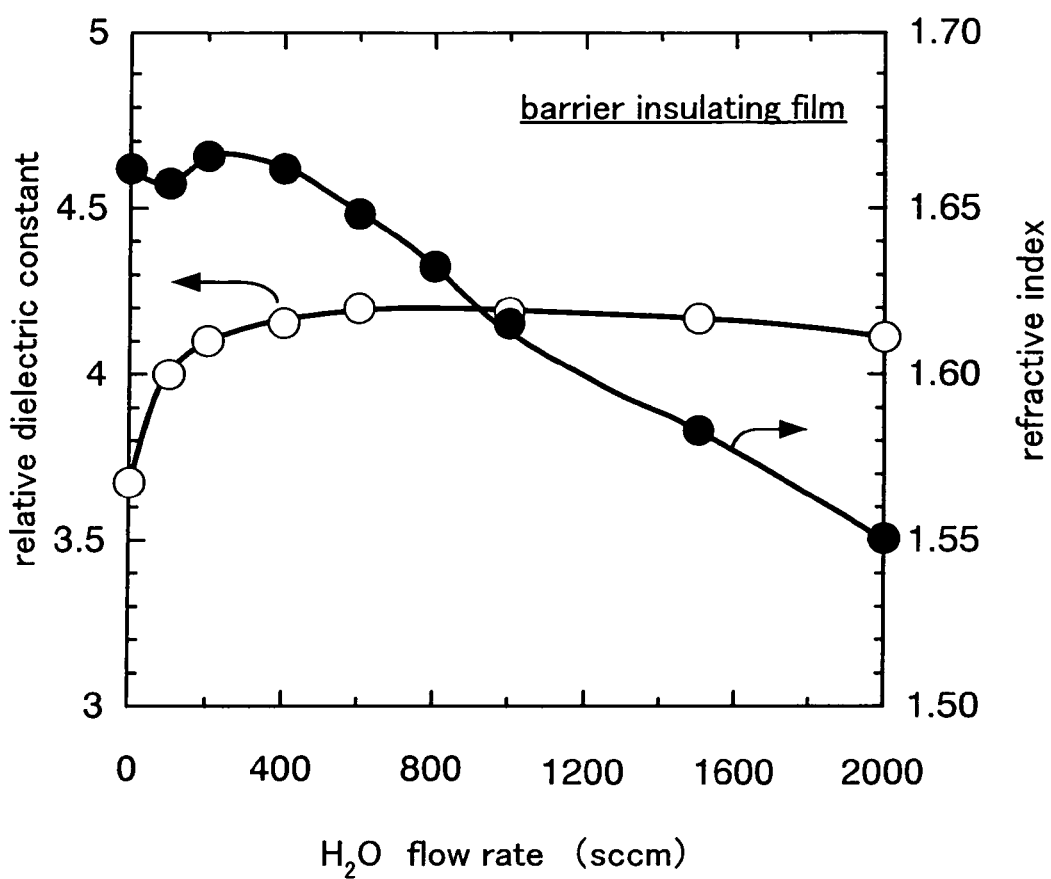
FIG. 7 is a graph showing a $H_2O$ dependency of the relative dielectric constant and the refractive index, in the silicon oxide film formed under film forming conditions IV in Fourth Example according to the semiconductor device manufacturing method as the first embodiment of the present invention.

(Film forming conditions IV)
(i) Film forming gas conditions
  HMDSO gas flow rate: 50 sccm
  $H_2O$ gas flow rate: 0 to 2000 sccm
  gas pressure: 1.0 Torr
(ii) Plasmanizing conditions
  high-frequency power (13.56 MHz) $P_{HF}$: 0 W
  low-frequency power (380 kHz) $P_{LF}$: 150 W
(iii) Substrate heating temperature: 375° C.
(iV) Formed silicon oxide film
  film thickness: 50 nm Investigated results are with regard to the silicon oxide film 32. These are shown in FIG. 7 for the $H_2O$ gas flow rate dependency of the relative dielectric constant (k) and the refractive index as the formed film immediately after the film formation. An ordinate on the left side of FIG. 7 denotes the relative dielectric constant represented in a linear scale, and an ordinate on the right side denotes the refractive index represented in a linear scale. Similarly, an abscissa of FIG. 7 denotes a $H_2O$ gas flow rate (sccm).

According to FIG. 7, the relative dielectric constant was increased as the $H_2O$ gas flow rate was increased until the $H_2O$ gas flow rate reached almost 400 sccm. In other words, the relative dielectric constant was 3.7 at the $H_2O$ gas flow rate of 0 sccm, while the relative dielectric constant was 4.2 at the $H_2O$ gas flow rate of 400 sccm. In the range in which the $H_2O$ gas flow rate exceeds 400 sccm, the relative dielectric constant was not so changed along with an increase of the $H_2O$ gas flow rate and was shifted around 4.2.

In this case, the refractive index was not so changed along with an increase of the $H_2O$ gas flow rate until the $H_2O$ gas flow rate comes up to almost 400 sccm, and was substantially around 1.66. However, the refractive index was reduced along with an increase of the $H_2O$ gas flow rate after the $H_2O$ gas flow rate was in excess of 400 sccm. That is, the refractive index was 1.66 at the $H_2O$ gas flow rate of 400 sccm, while the relative dielectric constant was 1.55 at the $H_2O$ gas flow rate of 2000 sccm.

Also, a leakage current density of the silicon oxide film formed under the same film forming conditions was investigated before and after the annealing process. The annealing conditions are given as follows.

Figure 8:
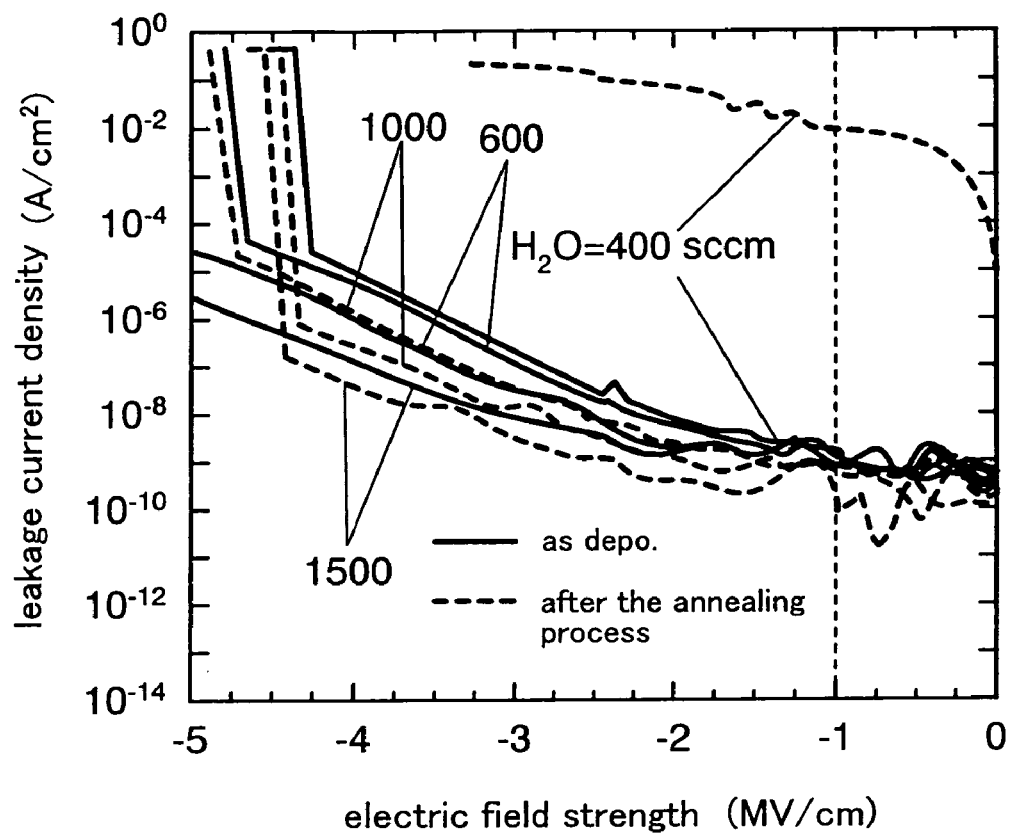
FIG. 8 is a graph showing an electric-filed strength dependency of a leakage current density before and after the annealing, in the silicon oxide film formed under film forming conditions IV in Fourth Example according to the semiconductor device manufacturing method as the first embodiment of the present invention.

(Annealing conditions)
(i) Atmospheric gas: $N_2$
(ii) Substrate heating temperature: 450° C.
(iii) Process time: 4 hours The results are shown in FIG. 8. An ordinate of FIG. 8 denotes the leakage current density ($A/cm^2$) represented in a logarithmic scale, and an abscissa of FIG. 8 denotes the electric field strength (MV/cm) represented in a linear scale. The electric field strength is converted from the applied voltage.

According to FIG. 8, it was checked that a Cu diffusion preventing capability depends upon the $H_2O$ gas flow rate during the film formation. In other words, in case the $H_2O$ gas flow rate is set to 400 sccm during the film formation, a sharply rising phenomenon of the leakage current density did not appear until the high electric-filed strength before the annealing process, whereas the sharply rising phenomenon of the leakage current density appeared at the low electric-filed strength after the annealing process. This indicates that an insulating property of the formed film is lost due to the diffusion of Cu. In contrast, in case the $H_2O$ gas flow rate is set to 600 sccm or more during the film formation, such phenomenon was not observed and the formed film still held the Cu diffusion preventing capability. The range of the $H_2O$ gas flow rate in excess of 600 sccm is used as the ground that the flow rate ratio of the $H_2O$ gas to the silicon-contained organic compound in the film forming gas of the Cu barrier insulating film should be set to 12 or more.

(5) FIFTH EXAMPLE

An insulating film in Fifth Example is another example of the Cu barrier insulating film. As a sample, a silicon oxide film 32a as the Cu barrier insulating film was formed on the copper film 31, like the Fourth Example. This silicon oxide film 32a was formed by the plasma CVD method under following film forming conditions. In order to investigate a $C_2H_4$ gas flow rate dependency, a $C_2H_4$ gas flow rate was changed. In third Example, in order to remove the surface oxide film, the pre-process of the copper wirings was carried out under the same conditions as First Example prior to the film formation of the silicon oxide film.

Figure 9:
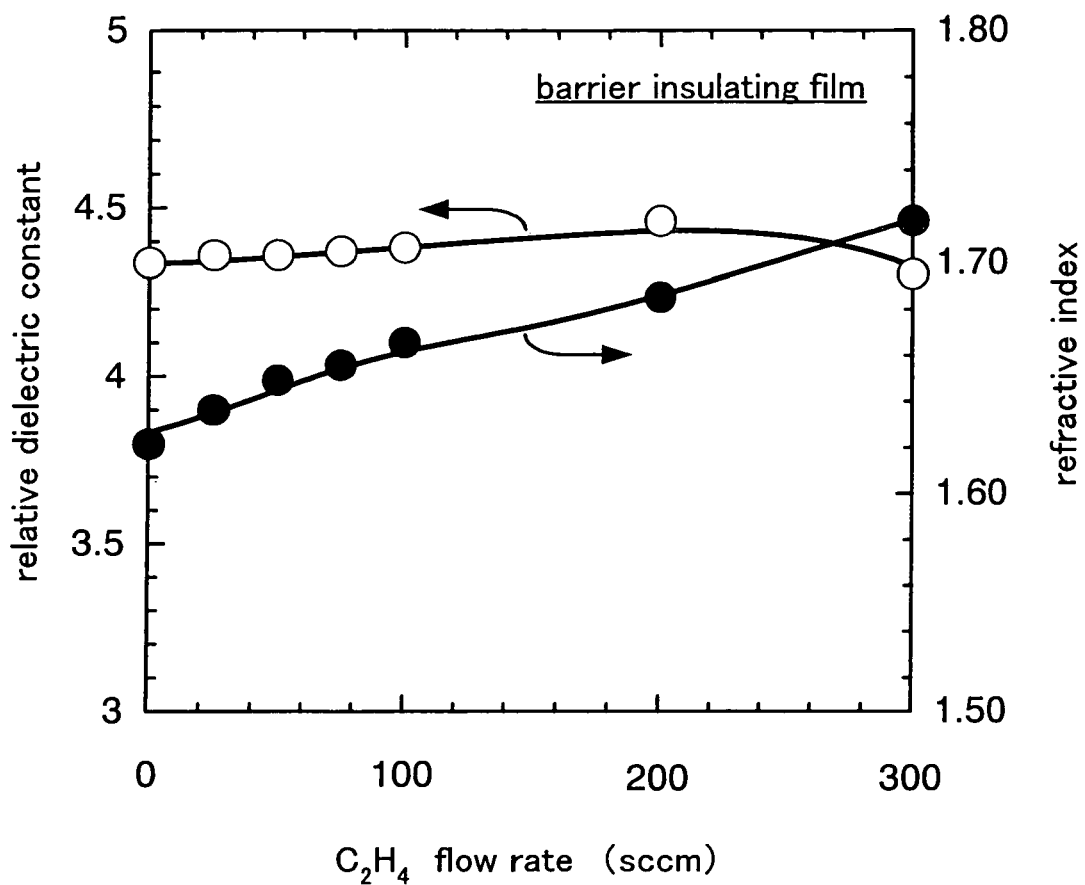
FIG. 9 is a graph showing a $C_2H_4$ dependency of the relative dielectric constant and the refractive index, in the silicon oxide film formed under film forming conditions V in Fifth Example according to the semiconductor device manufacturing method as the first embodiment of the present invention.

(Film forming conditions V)
(i) Film forming gas conditions
  HMDSO gas flow rate: 50 sccm
  $H_2O$ gas flow rate: 1000 sccm
  $C_2H_4$ gas flow rate: 0 to 300 sccm
  gas pressure: 1.0 Torr
(ii) Plasmanizing conditions
  high-frequency power (13.56 MHz) $P_{HF}$: 0 W
  low-frequency power (380 kHz) $P_{LF}$: 150 W
(iii) Substrate heating temperature: 375° C.
(iV) Formed silicon oxide film
  film thickness: 50 nm With regard to the silicon oxide film 32a, investigated results are shown in FIG. 9 for the dependency of the relative dielectric constant (k) and the refractive index upon the $C_2H_4$ gas flow rate during film formation. An ordinate on the left side of FIG. 9 denotes the relative dielectric constant represented in a linear scale, and an ordinate on the right side denotes the refractive index represented in a linear scale. Similarly, an abscissa of FIG. 9 denotes a $C_2H_4$ gas flow rate (sccm).

According to FIG. 9, the relative dielectric constant was not so changed with respect to the $C_2H_4$ gas flow rate during the film formation, and was shifted around 4.3 to 4.4. While, the refractive index was increased as the $C_2H_4$ gas flow rate was increased. That is, the refractive index was 1.62 at the $C_2H_4$ gas flow rate of 0 sccm, while the refractive index was 1.71 at the $C_2H_4$ gas flow rate of 300 sccm.

Also, with regard to the silicon oxide film formed under the same film forming conditions, the leakage current density was investigated before and after the annealing process. The annealing process are performed under the same conditions as Fourth Example.

Figure 10:
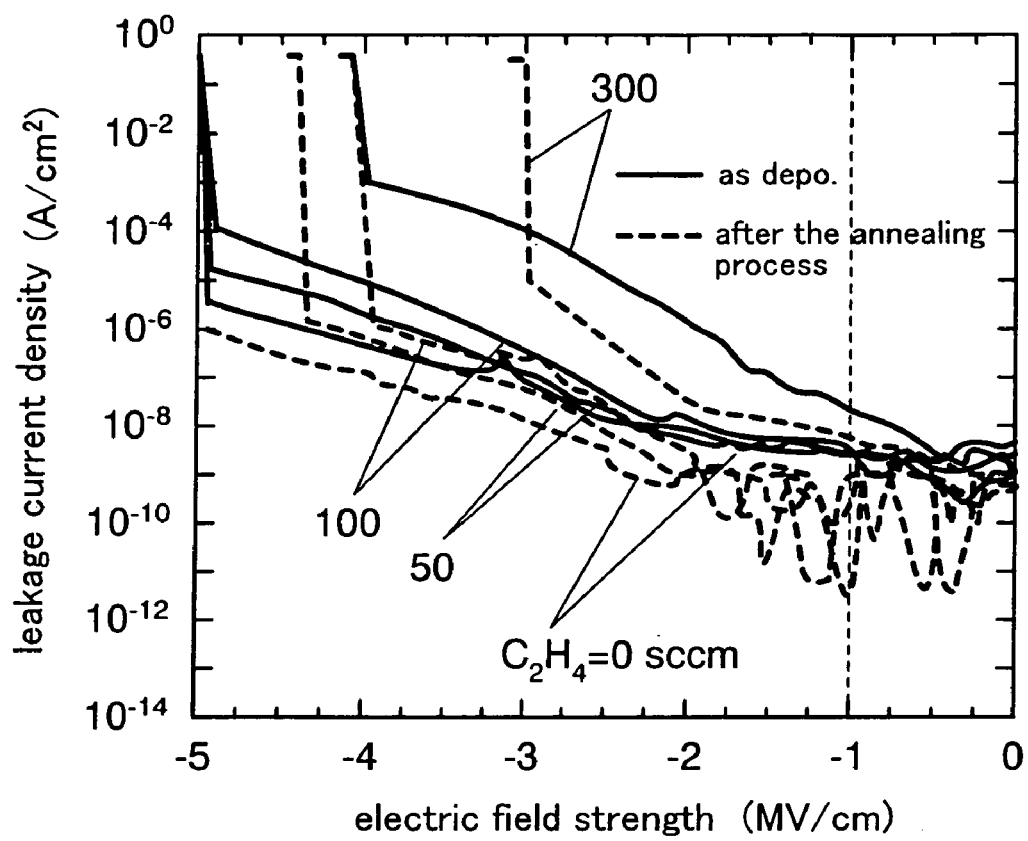
FIG. 10 is a graph showing the electric-filed strength dependency of the leakage current density before and after the annealing, in the silicon oxide film formed under film forming conditions V in Fifth Example according to the semiconductor device manufacturing method as the first embodiment of the present invention.

The results are shown in FIG. 10. An ordinate of FIG. 10 denotes the leakage current density ($A/cm^2$) represented in a logarithmic scale, and an abscissa of FIG. 10 denotes the electric field strength (MV/cm) represented in a linear scale.

According to FIG. 10, except the $C_2H_4$ gas flow rate of 0 sccm, the electric-filed strength at which the leakage current density rises suddenly was lowered to such an extent that the silicon oxide film is not damaged, in contrast to that before the annealing process. It was verified that the Cu diffusion preventing capability does not depends on the $C_2H_4$ gas flow rate during the film formation.

(6) SIXTH EXAMPLE

An insulating film in Sixth Example is still another example of the Cu barrier insulating film. As a sample, a silicon oxide film 32 as the Cu barrier insulating film was formed on the copper film 31, like the Fourth Example. This silicon oxide film 32 was formed by the plasma CVD method under following film forming conditions. In Sixth Example, in order to remove the surface oxide film, the pre-process of the copper wirings was carried out under the same conditions as First Example prior to the film formation of the silicon oxide film.

(Film forming conditions VI)
(i) Film forming gas conditions
  HMDSO gas flow rate: 50 sccm
  $H_2O$ gas flow rate: 1000 sccm
  gas pressure: 1.0 Torr
(ii) Plasmanizing conditions
  high-frequency power (13.56 MHz) $P_{HF}$: 300 W
  low-frequency power (380 kHz) $P_{LF}$: 25 W
(iii) Substrate heating temperature: 375° C.
(iV) Formed silicon oxide film
  film thickness: 50 nm An investigation was preformed for the relative dielectric constant (k) of the silicon oxide film 32 immediately after the film formation and 3.9 was obtained as the relative dielectric constant (k).

Also, with regard to the silicon oxide film formed under the same film forming conditions, the investigation was preformed for the leakage current density before and after the annealing process. The annealing process conditions are given as follows.

(Annealing conditions)
(i) Atmospheric gas : $N_2$
(ii) Substrate heating temperature: 450° C.
(iii) Process time: 4 hours The results are shown in FIG. 15. An ordinate of FIG. 15 denotes the leakage current density ($A/cm^2$) represented in a logarithmic scale, and an abscissa there denotes the electric field strength (MV/cm) represented in a linear scale. The electric field strength was exchanged from the applied voltage.

According to FIG. 15, the leakage current was very small such as $10^{-10}$ to $10^{-9}$ $A/cm^2$ at the electric-filed strength of 1 MV/cm, and the dielectric breakdown strength was sufficiently high. It was confirmed that the Cu diffusion preventing capability is high. Also, it is considered that the dependency of the Cu diffusion preventing capability upon H₂O gas flow rate during the film formation is identical to above Examples. That is, it is preferable that the flow rate ratio of the H₂O gas to the silicon-contained organic compound is set to the range exceeding 12.

Second Embodiment

Next, a semiconductor device and a method of manufacturing the same according to a second embodiment of the present invention will be explained with reference to FIGS. 12(a) to (g) hereunder.

Figure 12:
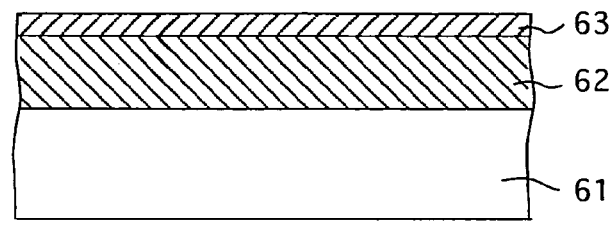
FIGS. 12(a) to (g) are sectional views showing semiconductor devices and methods of manufacturing the same according to second and third embodiments of the present invention.
Figure 12:
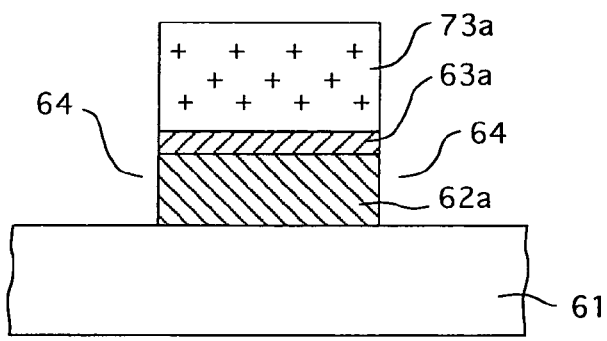
Figure 12:
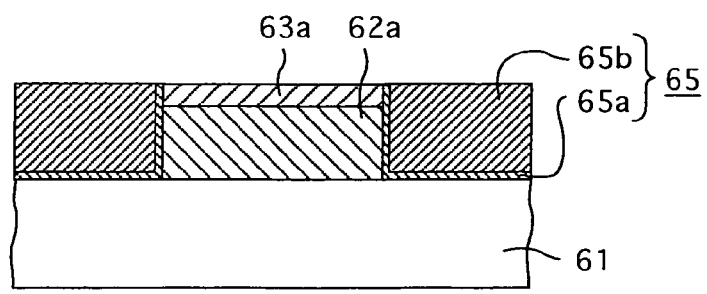
Figure 12:
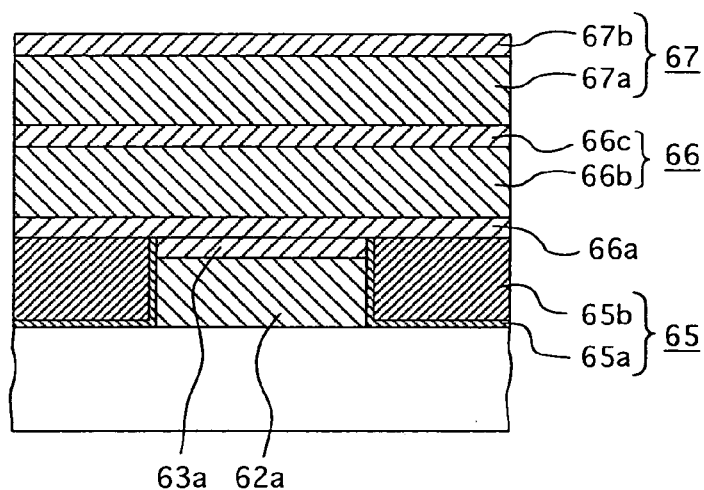
Figure 12:
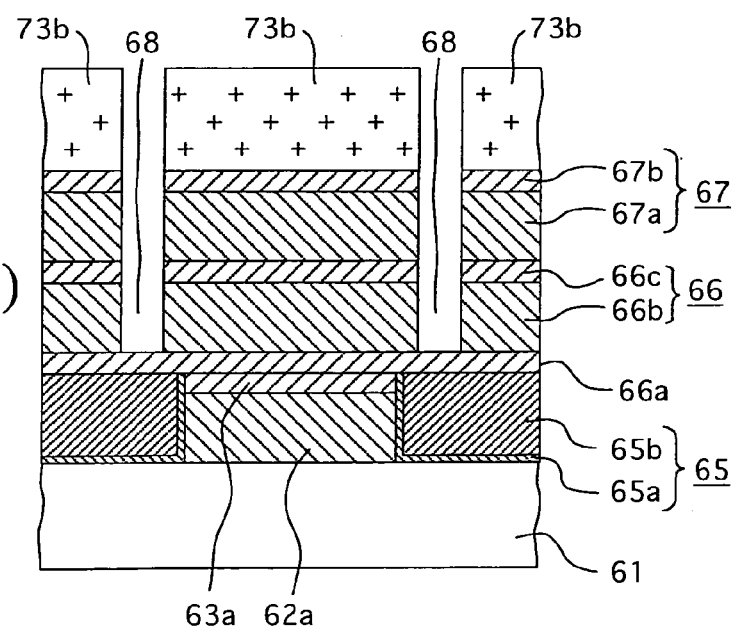
Figure 12:
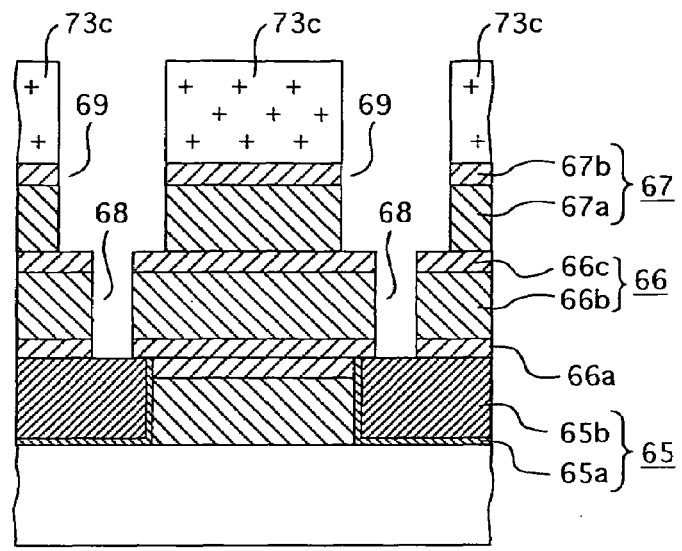
Figure 12:
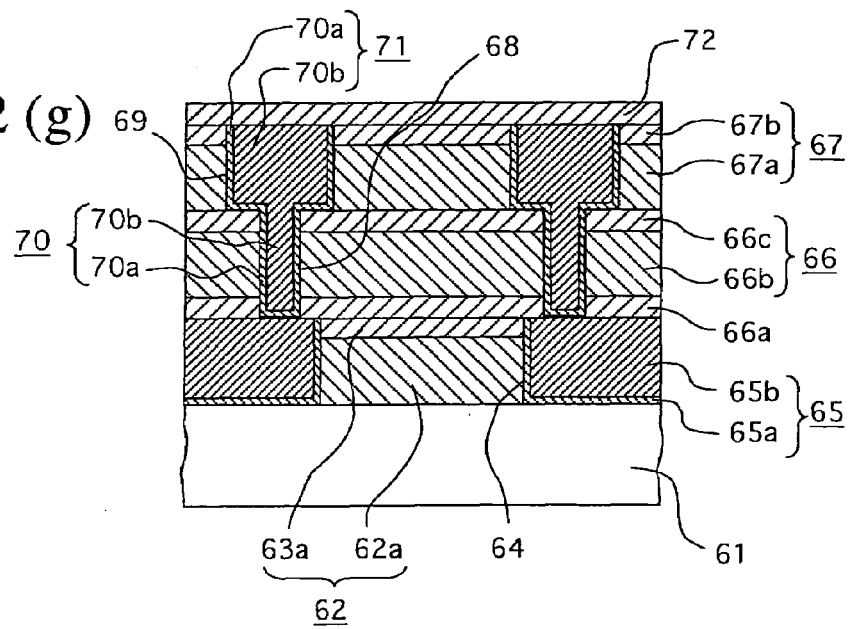
Figure 13:
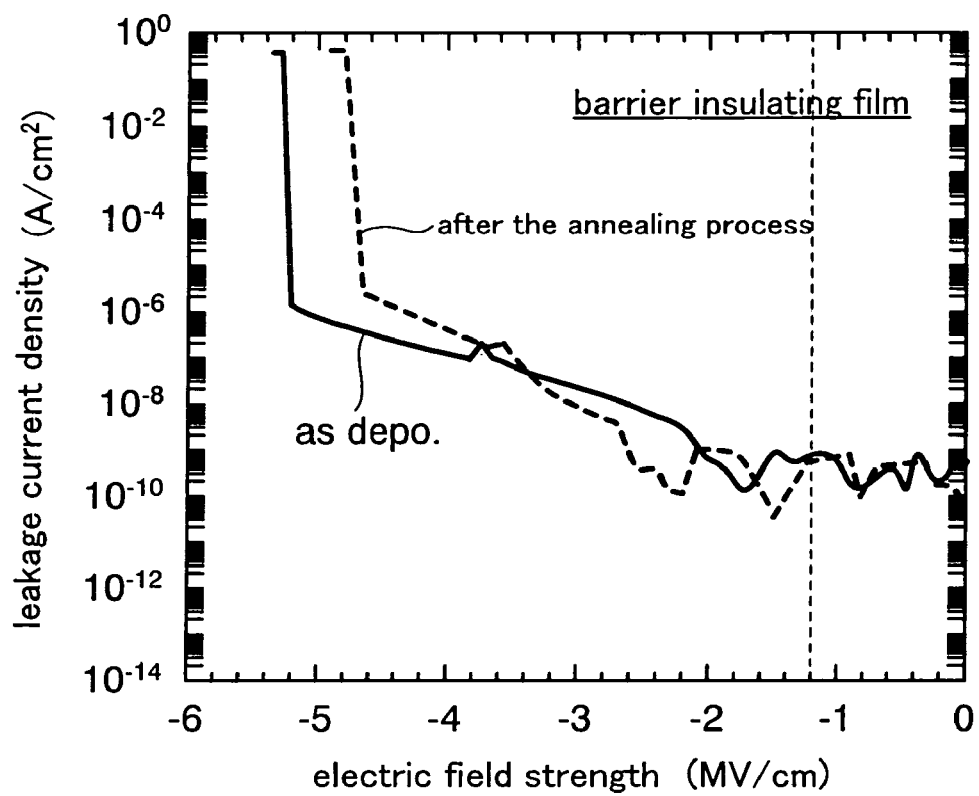
FIG. 13 is a graph showing the electric-field strength dependency of the leakage current density before and after the annealing, in the silicon oxide film formed under film forming conditions VI in Sixth Example according to the semiconductor device manufacturing method as the first embodiment of the present invention.

FIG. 12(g) is a sectional view showing the semiconductor device according to the second embodiment of the present invention. In this semiconductor device, as shown in FIG. 12(g), a lower wiring buried insulating film 62 is formed on a substrate 61. The lower wiring buried insulating film 62 is formed by laminating a main insulating film (low-dielectric insulating film) 62a made of an SiO₂ film of about 500 nm thickness and having a low dielectric constant, and a first upper protection layer (Cu barrier insulating film) 63a made of an SiO₂ film of about 50 nm thickness. Lower wirings 65 each consisting of a TaN film 65a serving as the copper diffusion preventing film and a copper film 65b are buried in lower wiring recesses 64 that pass through the lower wiring buried insulating film 62. A semiconductor substrate, other conductive layer, or an insulating substrate may be employed as the substrate 61.

An inter-wiring layer insulating film 66 in which via holes 68 are formed and an upper wiring buried insulating film 67 in which upper wiring recesses 69 are formed are formed on the resultant structure.

The inter-wiring layer insulating film 66 is constituted by a second lower protection layer (Cu barrier insulating film) 66a formed of an SiO₂ film of about 50 nm thickness, a main insulating film (low-dielectric insulating film) 66b made of an SiO₂ film of about 500 nm thickness and having a low dielectric constant, and a second upper protection layer (Cu barrier insulating film) 66c made of an SiO₂ film of about 50 nm thickness. The upper wiring buried insulating film 67 is constituted by a main insulating film (low-dielectric insulating film) 67a made of an SiO₂ film of about 500 nm thickness and having a low dielectric constant, and a third upper protection layer (Cu barrier insulating film) 67b formed of an SiO₂ film of about 50 nm thickness.

The upper wiring recess 69 has a larger opening area than the via hole 68, and is formed to be connected to the via hole 68. A connecting conductor 70 formed of a TaN film 70a as the copper diffusion preventing film and a copper film 70b and an upper wiring 71 formed similarly of the TaN film 70a as the copper diffusion preventing film and the copper film 70b are buried integrally in the via holes 68 and the upper wiring recesses 69 by the well-known dual-damascene method. Then, the overall uppermost surface is covered with an uppermost protection layer (Cu barrier insulating film) 72 formed of an SiO₂ film according to the present invention.

All the low-dielectric insulating film and the Cu barrier insulating film as shown above are the insulating films according to the present invention.

Next, a semiconductor device manufacturing method according to a second embodiment of the present invention will be explained with reference to FIGS. 12(a) to (g) hereunder. Suppose that the film forming equipment in FIG. 1 is employed.

First, as shown in FIG. 12(a), the substrate 61 is loaded into the chamber 1 of the film forming equipment, and then the SiO₂ film 62 having a low dielectric constant and an about 500 nm thickness is formed on the substrate 61. The SiO₂ film 62 serves as a main insulating film of the lower wiring buried insulating film. As the film forming conditions, a flow rate of the silicon-contained organic compound having the siloxane bond, e.g., HMDSO gas is set to 50 sccm, a flow rate of the H₂O gas is set to 1000 sccm, and a gas pressure is set to 1.75 Torr. As the plasmanizing conditions of the film forming gas, the low-frequency power ($P_{LF}$) of a frequency of 380 kHz is not applied, but the high-frequency power ($P_{HF}$) of a frequency of 13.56 MHz is applied at 300 W. A temperature of the substrate is set to 375° C. These film forming conditions correspond to the film forming conditions I in First Example of the first embodiment. In addition, the plasma process applied to the formed film in Third Example, the annealing process applied to the formed film in the nitrogen or the inert gas atmosphere, the surface layer removing process applied to the formed film, and the waterproof process applied to the formed film by the process gas having a CH₃ group in the low pressure are carried out in the same chamber after the film formation. In this case, when the barrier insulating film is formed subsequently as described in the following, the waterproof process may be omitted appropriately.

In turn, an SiO₂ film (Cu barrier insulating film) 63 of about 50 nm thickness is formed in the same chamber by the plasma CVD method using the silicon-contained organic compound having the siloxane bond, e.g., the HMDSO gas, and H₂O as the film forming gas. As the film forming conditions, a flow rate of the HMDSO gas is set to 50 sccm, a flow rate of the H₂O gas is set to 1000 sccm, and a gas pressure is set to 1.0 Torr. As the plasmanizing conditions of the film forming gas, the high-frequency power ($P_{HF}$) of a frequency of 13.56 MHz is not applied, but the low-frequency power ($P_{LF}$) of a frequency of 380 kHz is applied at 150 W. Also, the substrate temperature is set to 375° C. These film forming conditions correspond to the film forming conditions IV in Fourth Example of the first embodiment. In the formed SiO₂ film 63, the relative dielectric constant measured at a frequency of 1 MHz was almost 4.2, and the leakage current density at the electric field strength of 4 MV/cm was $10^{-6}$ A/cm².

Then, the substrate 61 is taken out from the chamber 1, and then a resist film made of chemically amplified photoresist, or the like is formed on the SiO₂ film 63. Then, opening portions of the resist film are formed in areas, in which a wiring recess is formed, by the photolithography method, and a mask 73a is formed, as shown in FIG. 12(b). At this time, since the SiO₂ film 63 does not contain the nitrogen, the excessive crosslinking reaction caused by the nitrogen can be suppressed in the crosslinking reaction of the resist film 73a and thus the crosslinking reaction is generated only in the areas defined by the exposure range. Therefore, the mask 73a can be formed with good dimensional precision. Then, as shown in FIG. 12(b), the wiring recesses 64 are formed by etching the SiO₂ films 63 and 62 based on the mask 73a. The SiO₂ film 63a serves as a protection layer.

Then, as shown in FIG. 12(c), the TaN film 65a is formed on inner surfaces of the wiring recesses 64 as the copper diffusion preventing film. Then, a copper seed layer (not shown) is formed and then the copper film 65b is buried. Thus, the lower wirings 65 each consisting of the TaN film and the Ta film 65a and the copper film 65b are formed.

Then, prior to the film formation, the surface oxide film is removed by executing the pre-process of the surface of the copper film 65b. As the processing method, the parallel-plate type plasma-enhanced CVD equipment is employed, NH₃ is introduced at a flow rate of 500 sccm and then the gas pressure is adjusted to 1 Torr. Then $NH_3$ is plasmanized by applying a power of about 100 W at a frequency of 13.56 MHz, and then the copper film 65b is brought into contact with the plasma while heating the substrate 61 to 375° C.

Then, the substrate 61 is loaded into the chamber 1 of the film forming equipment. Then, as shown in FIG. 12(d), the protection layer (Cu barrier insulating film) 66a made of an $SiO_2$ film is formed to cover the lower wirings 65. As the film forming conditions of the protection layer 66a, a flow rate of the HMDSO gas is set to 50 sccm, a flow rate of the $H_2O$ gas is set to 1000 sccm, a flow rate of the $C_2H_4$ gas is set to 100 sccm, and a gas pressure is set to 1.0 Torr. As the plasmanizing conditions of the film forming gas, the high-frequency power ($P_{HF}$) of the frequency of 13.56 MHz is not applied, but the low-frequency power ($P_{LF}$) of the frequency of 380 kHz is applied at 150 W. Also, the substrate temperature is set to 375° C. These film forming conditions correspond to the film forming conditions V in Fifth Example of the first embodiment.

Then, the insulating film (low-dielectric insulating film) 66b serving as the main insulating film of the inter-wiring layer insulating film 66 and made of an $SiO_2$ film of about 500 nm thickness, and the protection layer (Cu barrier insulating film) 66c made of an $SiO_2$ film of about 50 nm thickness are formed successively on the protection layer 66a in the same chamber 1. Thus, the inter-wiring layer insulating film 66 in which the connecting conductor is buried is formed.

As to the main insulating film 66b, the film forming conditions and the processing conditions after the film formation are set identically to those of the lower wiring buried insulating film 62. Also, the film forming conditions of the protection layer 66c are set identically to those of the protection layer 66a.

Then, the insulating film (low-dielectric insulating film) 67a serving as the main insulating film of the wiring buried insulating film 67 and made of an $SiO_2$ film, and the protection layer (Cu barrier insulating film) 67b made of an $SiO_2$ film are formed successively on the protection layer 66c in the same chamber 1 in the same manner. Thus, the wiring buried insulating film 67 in which the upper wiring is buried is formed. As to the main insulating film 67a, the film forming conditions and the processing conditions after the film formation are set identically to those of the lower wiring buried insulating film 62. Also, the film forming conditions of the protection layer 67b are set identically to those of the protection layer 66a.

Then, the substrate 61 is taken out from the chamber 1 of the film forming equipment. As shown in FIG. 12(e) to FIG. 12(g), the connecting conductor 70 and the upper wiring 71 are formed by the well-known dual damascene method. The dual damascene method will be explained in detail in the following.

More particularly, after the resist film is formed on the protection layer 67b, opening portions are formed in the resist film in areas in which the via hole is formed by the photolithography method. Thus, as shown in FIG. 12(e), masks 73b are formed. At this time, since the protection layer 67b does not contain the nitrogen, the excessive crosslinking reaction caused by the nitrogen can be suppressed in the crosslinking reaction of the resist film 73b and thus the crosslinking reaction is generated only in the areas defined by the exposure range. Therefore, the mask 73b can be formed with good dimensional precision.

Then, the protection layer 67b and the insulating film 67a, the protection layer 66c and the insulating film 66b are etched via the opening portions in the resist film 73b to pass therethrough. As a result, the opening portions 68 are formed in the protection layer 66c and the main insulating film 66b out of the inter-wiring layer insulating film 66.

Then, another resist film is formed on the protection layer 67b, and then opening portions are formed in areas in which the wiring recess is formed. Thus, as shown in FIG. 12(f), masks 73c are formed. At this time, since the protection layer 67b, the insulating film 67a, the protection layer 66c, the insulating film 66b, and the protection layer 66a do not contain the nitrogen, the excessive crosslinking reaction caused by the nitrogen can be suppressed in the crosslinking reaction of the resist film 73c and thus the crosslinking reaction is generated only in the areas defined by the exposure range. Therefore, the mask 73c can be formed with good dimensional precision.

Then, the opening portion of the mask 73c is formed larger than an opening area of the precedent opening portion to contain the precedent opening portion. Then, the protection layer 67b and the insulating film 67a are etched via the opening portions of the masks 73c to pass therethrough. At this time, since the underlying protection layer 66c is formed by using the film forming gas containing a $C_2H_4$ gas, it has an etching resistance against the etching gas for the main insulating film 67a. Thus, the etching is stopped by the protection layer 66c. Accordingly, the wiring recesses 69 are formed in the wiring buried insulating film 67. Then, the via holes 68 that pass through the inter-wiring layer insulating film 66 are formed by etching the protection layer 66a. As a result, the lower wiring 65 is exposed from the bottom portions of the via holes 68, and the lower wiring 65 and the wiring recess 69 are connected to each other via the via holes 68.

Then, as shown in FIG. 12(g), the TaN film and the Ta film 70a are formed on inner surfaces of the via holes 68 and the wiring recesses 69, then the copper seed layer (not shown) is formed, and then the copper film 70b is buried thereon. Thus, the connecting conductors 70 and the upper wirings 71 are formed. Above steps constitute the so-called dual damascene method.

Then, the surface oxide film is removed by executing the pre-process of the surface of the copper film 70b under the same conditions as the pre-process conditions of the surface of the copper film 65b. Then, the protection layer 72 made of an $SiO_2$ film is formed on the overall surface by the same film forming method as that of the protection layer 63 or 66a. With the above, the semiconductor device having the multi-layered wiring consisting mainly of the copper film is completed.

As described above, according to the semiconductor device manufacturing method of the second embodiment, the main insulating films 62a, 66b, 67a are formed under the film forming conditions I in First Example of the first embodiment, and then the plasma process or the annealing process, the surface layer removing process, and the waterproof process are applied after the film formation. In other words, since the main insulating films 62a, 66b, 67a are formed under the film forming conditions similar to Third Example of the first embodiment, these films have a low dielectric constant of 2.5 or less and has a higher moisture resistance. Also, since the protection layers 63a, 66a, 66c, 67b, 72 are formed under the film forming conditions IV or V in Fourth and Fifth Examples of the first embodiment, these layers have the high Cu diffusion preventing capability.

In addition, since the insulating films 66b, 67a and the protection layers 66a, 66c, 67b exposed to the surface do not contain the nitrogen, the masks 73c can be formed with good precision when the lower wiring recesses 64, the via holes 68, and the upper wiring recesses 69 are formed by the photolithography method.

Further, the via holes 68 and the wiring recesses 69 connected to the via holes 68 are formed alternately to pass through the inter-wiring layer insulating film 66 and the wiring buried insulating film 67 such that their opening areas are increased sequentially from the bottom. In other words, the protection layer 66c acts as the underlying layer of the insulating film 67a that is etched in selectively etching the main insulating film 67a. Since the protection layer 66c to which the present invention is applied is formed by using the film forming gas containing $C_2H_4$, such protection layer 66c functions effectively not only as the etching stopper against the etchant but also as the mask to prevent the excessive etching of the underlying insulating film 66b.

Third Embodiment

Next, a semiconductor device and a method of manufacturing the same according to a third embodiment of the present invention will be explained hereunder.

A configuration similar to the semiconductor device in FIG. 12(g) can be applied to the semiconductor device according to the third embodiment.

In this case, the main insulating films 62a, 66b, 67a correspond to the low-dielectric insulating films of the present embodiment, while the protection layers 63a, 66a, 66c, 67b, 72 correspond to the barrier insulating films of the present embodiment.

Also, a method similar to the semiconductor device manufacturing method in FIGS. 12(a) to (g) can be applied to the semiconductor device manufacturing method according to the third embodiment.

In this case, the low-dielectric insulating films corresponding to the main insulating films 62a, 66b, 67a are formed under the film forming conditions given as follows.

(Film forming conditions)
(i) Film forming gas conditions
  HMDSO gas flow rate: 50 sccm
  $H_2O$ gas flow rate: 1000 sccm
  gas pressure: 2.0 Torr
(ii) Plasmanizing conditions
  high-frequency power (13.56 MHz) $P_{HF}$: 300 W
  low-frequency power (380 kHz) $P_{LF}$: 0 W
(iii) Substrate heating temperature: 300° C.
(iV) Formed silicon oxide film
  film thickness: 700 nm The plasma process or the annealing process, the surface layer removing process, and the waterproof process are executed after the film formation. Also, the barrier insulating films corresponding to the protection layers 63a, 66a, 66c, 67b, 72 are formed under the film forming conditions VI in Sixth Example of the first embodiment.

According to the third embodiment of the present invention described above, since the low-dielectric insulating films are formed under the above film forming conditions and then the plasma process or the annealing process, the surface layer removing process, and the waterproof process are carried out after the film formation, these films have a low dielectric constant of around 2.4 and has a higher moisture resistance. Also, since the barrier insulating films are formed under the film forming conditions VI in Sixth Example of the first embodiment, these films have the high Cu diffusion preventing capability.

As described above, the present invention is explained in detail through the embodiments, but the scope of the present invention is not limited to examples shown concretely in the above embodiments. Variations of the above embodiments such that those do not depart from the gist of the present invention are contained in the scope of the present invention.

For instance, in the second embodiment, the film forming conditions of the main insulating films (low-dielectric insulating films) 62a, 66b, 67a are set to the conditions set forth in First Example and Third Example of the first embodiment. But these conditions may be varied appropriately within the range of the film forming conditions explained in the first embodiment and then applied. Also, in the third embodiment, the film forming conditions of the main insulating films (low-dielectric insulating films) 62a, 66b, 67a may be varied appropriately within the range of the film forming conditions explained in the first embodiment and then applied.

Also, the film forming conditions of the protection layers (Cu barrier insulating films) 63a, 66a, 66c, 67b, 72 are set to the conditions set forth in Fourth Example, Fifth Example, and Sixth Example of the first embodiment. But these conditions may be varied appropriately within the range of the film forming conditions explained in the first embodiment and then applied.

As described above, according to the present invention, in the film formation of the low-dielectric insulating film, the film forming gas containing at least any one of the silicon-contained organic compound having the siloxane bond or the silicon-contained organic compound having the $CH_3$ group and $H_2O$ are produced by setting the flow rate ratio of $H_2O$ to the silicon-contained organic compound to 4 or more, and adjusting a gas pressure to 1.5 Torr or more, then the plasma is generated by applying the high-frequency power of a frequency of preferably 1 MHz or more to the film forming gas, and then the film is formed on the substrate that is heated up to preferably 400° C. or less. In addition, after the film formation, the plasma is generated by applying the power of a frequency of preferably below 1 MHz to He, etc., and then the plasma process is applied to the formed film by using the plasma or the annealing process is executed at the temperature of 400° C. or more by using the nitrogen gas, etc. As a result, in the low-dielectric insulating film, while maintaining the low relative dielectric constant of 2.4 to 2.5, no nitrogen can be contained or the nitrogen content can be suppressed to such an extent that the crosslinking reaction of the resist is not affected. Further, with regard to the film which is exposed after the surface layer of the formed film is removed and may have a high hygroscopic property, if the film is put under the waterproof process such that the film is heated in the low-pressure atmosphere of the process gas having a $CH_3$ group, it can result in a further excellent waterproof of the film.

Also, in the Cu barrier insulating film used together with the low-dielectric insulating film, the film forming gas containing at least any one of the silicon-contained organic compound having the siloxane bond or the silicon-contained organic compound having the $CH_3$ group and $H_2O$ are produced by increasing the flow rate ratio of $H_2O$ to the silicon-contained organic compound to 12 or more, then the low-frequency power of the frequency of 1 MHz or less is applied to the substrate to bias it and applied to the film forming gas to generate the plasma, and then the film is formed on the substrate that is heated up to preferably 200 to 400° C. According to the above film forming conditions, while forming the film whose Cu diffusion preventing function is enhanced and which has good film quality, no nitrogen can be contained in it or the nitrogen content can be suppressed in it to such an extent that the crosslinking reaction of the resist is not affected.

Description is performed as follows for the features of the present inventions disclosed above.

1. A semiconductor device manufacturing method comprising the steps of: generating a film forming gas by using any one of a silicon-contained organic compound having a siloxane bond and a silicon-contained organic compound having a $CH_3$ group and in addition $H_2O$, setting a flow rate ratio of $H_2O$ to the silicon-contained organic compound to 4 or more, and adjusting a gas pressure to 1.5 Torr or more; applying a power to the film forming gas to generate a plasma thereof so as to react it, and thus forming a low-dielectric insulating film on a substrate; generating a process gas containing at least any one of He, Ar, $H_2$ and deuterium; generating a plasma by applying a power to the process gas; and bringing the low-dielectric insulating film into contact with the plasma of the process gas.

2. A semiconductor device manufacturing method according to No. 1, wherein the power applied to the film forming gas is a power having a frequency of 1 MHz or more.

3. A semiconductor device manufacturing method according to No. 1 or 2, wherein the power applied to the process gas is a power having a frequency of below 1 MHz.

4. A semiconductor device manufacturing method according to No. 1 or 2, wherein the power applied to the process gas is a power having a frequency of 1 MHz or more.

5. A semiconductor device manufacturing method according to any one of Nos. 1 to 4, wherein a pressure of the process gas is adjusted to 1.0 Torr or less.

6. A semiconductor device manufacturing method according to any one of Nos. 1 to 4, wherein a pressure of the process gas is adjusted to 0.5 Torr or less.

7. A semiconductor device manufacturing method according to any one of Nos. 1 to 6, wherein, in the step of bringing the low-dielectric insulating film into contact with the plasma of the process gas, a temperature of the low-dielectric insulating film is raised up to 375° C. or more.

8. A semiconductor device manufacturing method according to any one of Nos. 1 to 7, wherein the step of bringing the low-dielectric insulating film into contact with the plasma of the process gas is followed by the further step of:
removing a surface layer of the low-dielectric insulating film.

9. A semiconductor device manufacturing method according to No. 8, wherein the step of removing the surface layer of the low-dielectric insulating film is followed by the further subsequent step of:
increasing a temperature of the low dielectric insulating film to 375° C. or more at an atmospheric pressure or a low pressure, and then bringing the low-dielectric insulating film into contact with a process gas having a $CH_3$ group, while the low-dielectric insulating film is not brought into contact with an atmosphere.

10. A semiconductor device manufacturing method comprising the steps of: generating a film forming gas by using any one of a silicon-contained organic compound having a siloxane bond and a silicon-contained organic compound having a $CH_3$ group and in addition $H_2O$, setting a flow rate ratio of $H_2O$ to the silicon-contained organic compound to 4 or more, and adjusting a gas pressure to 1.5 Torr or more; applying a power to the film forming gas to generate a plasma thereof so as to react it, and thus forming a low-dielectric insulating film on a substrate; and annealing the low-dielectric insulating film in an atmosphere of a nitrogen gas or an inert gas at a temperature of 400° C. or more.

11. A semiconductor device manufacturing method according to No. 10, wherein the power applied to the film forming gas is a power having a frequency of 1 MHz or more.

12. A semiconductor device manufacturing method according to No. 10 or 11, wherein the step of annealing the low-dielectric insulating film is followed by the further step of: removing a surface layer of the low-dielectric insulating film.

13. A semiconductor device manufacturing method according to No. 12, wherein the step of removing the surface layer of the low-dielectric insulating film is followed without bringing the low-dielectric insulating film into contact with an atmosphere by the further subsequent step of: increasing a temperature of the low-dielectric insulating film to 375° C. or more at an atmospheric pressure or a low pressure, and then bringing the low-dielectric insulating film into contact with a process gas having a $CH_3$ group.

14. A semiconductor device manufacturing method according to No. 9 or 13, wherein the process gas having the $CH_3$ group is a methylsilane consisting of any one of monomethylsilane ($SiH_3(CH_3)$), dimethylsilane ($SiH_2(CH_3)_2$), trimethylsilane ($SiH(CH_3)_3$), or tetramethylsilane ($Si(CH_3)_4$), or an alkoxysilane consisting of any one of trimethylmethoxysilane ($Si(CH_3)_3(OCH_3)$), dimethyldimethoxysilane ($Si(CH_3)_2(OCH_3)_2$), or methyltrimethoxysilane (TMS: $Si(CH_3)(OCH_3)_3$).

15. A semiconductor device manufacturing method according to any one of Nos. 1 to 14, wherein a pressure of the film forming gas is adjusted to 1.75 Torr or more.

16. A semiconductor device manufacturing method according to any one of Nos. 1 to 15, wherein in the step of forming the low-dielectric insulating film, a temperature of the substrate is raised up to 25° C. or more but 400° C. or less.

17. A semiconductor device manufacturing method comprising the steps of: generating a film forming gas by using any one of a silicon-contained organic compound having a siloxane bond and a silicon-contained organic compound having a $CH_3$ group and in addition $H_2O$, and setting a flow rate ratio of $H_2O$ to the silicon-contained organic compound to 12 or more; increasing a temperature of a substrate up to 200° C. or more but 400° C. or less; and applying a power to the film forming gas to generate a plasma thereof so as to react it, and thus forming a barrier insulating film on the substrate whose temperature is raised.

18. A semiconductor device manufacturing method according to No. 17, wherein, in the step of generating the film forming gas, a pressure of the film forming gas is adjusted to below 1.0 Torr and, in the step of forming the barrier insulating film, a power of a frequency of below 1 MHz is applied to the substrate to bias the substrate and to generate a plasma of the film forming gas by the power of the frequency of below 1 MHz so as to react it, and thus the barrier insulating film is formed.

19. A semiconductor device manufacturing method according to No. 17, wherein, in the step of generating the film forming gas, a pressure of the film forming gas is adjusted to below 1.0 Torr and, in the step of forming the barrier insulating film, a power of a frequency of below 1 MHz is applied to the substrate to bias the substrate while at least the power of the frequency of 1 MHz or more out of the power of the frequency of below 1 MHz or the power of the frequency of 1 MHz or more is applied to the film forming gas, whose pressure is adjusted to 1.0 Torr or more, to generate a plasma thereof so as to react it, and thus the barrier insulating film is formed.

20. A semiconductor device manufacturing method comprising the steps of: generating a film forming gas by using any one of a silicon-contained organic compound having a siloxane bond and a silicon-contained organic compound having a CH₃ group and H₂O, and setting a flow rate ratio of H₂O to the silicon-contained organic compound to 12 or more; adjusting a pressure of the film forming gas to below 1.0 Torr; increasing a temperature of a substrate up to 200° C. or more but 400° C. or less; applying a power of a frequency of below 1 MHz to the substrate to bias the substrate and to generate a plasma of the film forming gas by the power of the frequency of below 1 MHz so as to react the plasma, and thus forming a first insulating film; generating the film forming gas; adjusting a pressure of the film forming gas to 1.0 Torr or more; increasing a temperature of a substrate up to 200° C. or more but 400° C. or less; and applying a power of a frequency of below 1 MHz to the substrate to bias the substrate while applying at least the power of the frequency of 1 MHz or more out of the power of the frequency of below 1 MHz or the power of the frequency of 1 MHz or more to the film forming gas, whose pressure is adjusted to 1.0 Torr or more, to generate a plasma thereof so as to react it, and thus forming a second insulating film on the first insulating film, whereby the barrier insulating film composed of the first insulating film and the second insulating film is formed.

21. A semiconductor device manufacturing method according to any one of Nos. 17 to 20, wherein dinitrogen monoxide (N₂O) is added, or nitrogen (N₂) or ammonia (NH₃) is added, or dinitrogen monoxide (N₂O) and ammonia (NH₃) are added to the film forming gas.

22. A semiconductor device manufacturing method according to any one of Nos. 1 to 21, wherein the silicon-contained organic compound having the siloxane bond consists of any one of hexamethyldisiloxane (HMDSO:

(CH₃)₃Si—O—Si(CH₃)₃), octamethylcyclotetrahexane (OMCTS)

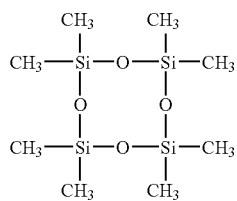

octamethyltrisiloxane (OMTS), or

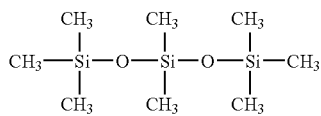

tetramethylcyclotetrasiloxane (TMCTS)

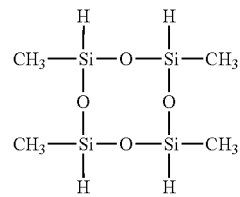

23. A semiconductor device manufacturing method according to any one of Nos. 1 to 21, wherein the silicon-contained organic compound having the siloxane bond consists of a compound obtained by replacing at least one CH₃ group of any one of hexamethyldisiloxane (HMDSO:

(CH₃)₃Si—O—Si(CH₃)₃), octamethylcyclotetrahexane (OMCTS)

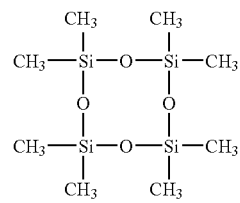

octamethyltrisiloxane (OMTS), or

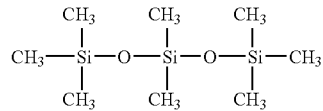

tetramethylcyclotetrasiloxane (TMCTS)

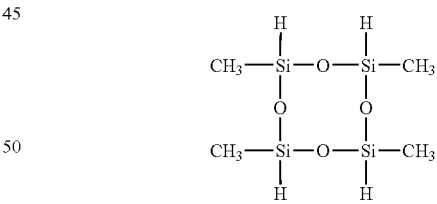

with F.

24. A semiconductor device manufacturing method according to any one of Nos. 1 to 23, wherein the silicon-contained organic compound having the CH₃ group is a methylsilane consisting of any one of monomethylsilane (SiH₃(CH₃)), dimethylsilane (SiH₂(CH₃)₂), trimethylsilane (SiH(CH₃)₃), or tetramethylsilane (Si(CH₃)₄), or an alkoxysilane consisting of any one of trimethylmethoxysilane (Si(CH₃)₃(OCH₃)), dimethyldimethoxysilane (Si(CH₃)₂(OCH₃)₂), or methyltrimethoxysilane (TMS: Si(CH₃)(OCH₃)₃).

25. A semiconductor device manufacturing method according to any one of Nos. 1 to 24, wherein $C_xH_y$ (x, y are a positive integer), $C_xH_yF_z$ or $C_xH_yB_z$ (x, y are 0 (where, except the case x=y=0) or a positive integer, z is a positive integer) is added to the film forming gas.

26. A semiconductor device manufacturing method according to No. 25, wherein $C_xH_y$ is $C_2H_4$.

27. A semiconductor device manufacturing method according to No. 25, wherein $C_xH_yF_z$ is $C_3F_8$, $C_4F_8$ or $CHF_3$.

28. A semiconductor device manufacturing method according to No. 25, wherein $C_xH_yB_z$ is $B_2H_6$.

29. A semiconductor device manufacturing method comprising the steps of: forming the low-dielectric insulating film by the semiconductor device manufacturing method set forth in No. 1; and forming the barrier insulating film by the semiconductor device manufacturing method set forth in No. 17 or 20.

30. A semiconductor device manufacturing method comprising the steps of: forming the low-dielectric insulating film by the semiconductor device manufacturing method set forth in No. 10; and forming the barrier insulating film by the semiconductor device manufacturing method set forth in No. 17 or 20.

31. A semiconductor device manufacturing method according to No. 29 or 30, wherein the step of forming the low-dielectric insulating film is followed without exposing the low-dielectric insulating film to an atmosphere by the further subsequent step of: forming the barrier insulating film without exposing the low-dielectric insulating film to an atmosphere.

32. A semiconductor device manufacturing method according to any one of Nos. 1 to 31, wherein wirings or electrodes consisting mainly of a copper film are formed on the substrate.

33. A semiconductor device manufactured by the semiconductor device manufacturing method set forth in any one of Nos. 1 to 32.

The invention claimed is:

1. A semiconductor device manufacturing method comprising the steps of:
generating a film-forming gas of (1) one of a silicon-containing organic compound having a siloxane bond and a silicon-containing organic compound having a $CH_3$ group and (2) $H_2O$;
setting a flow rate ratio of $H_2O$ to the silicon-containing organic compound to 4 or more;
adjusting pressure of the film-forming gas to 1.5 Torr or more;
applying power to the film-forming gas to generate a plasma thereof so as to react it, and thus forming a low-dielectric insulating film on a substrate;
generating a process gas containing at least one of He, Ar, $H_2$ and deuterium;
generating a plasma by applying power to the process gas;
bringing the low-dielectric insulating film into contact with the plasma of the process gas; and
removing a surface layer of the low-dielectric insulating film.

2. A semiconductor device manufacturing method according to claim 1, wherein the step of removing the surface layer of the low-dielectric insulating film is followed by the further subsequent step of:
heating the low dielectric insulating film to 375° C. or more at an atmospheric pressure or a lower pressure, and then bringing the low-dielectric insulating film into contact with a process gas having a $CH_3$ group, while the low-dielectric insulating film is not brought into contact with ambient atmosphere.

3. A semiconductor device manufacturing method according to claim 1, wherein $C_xH_y$ (wherein x and y are each a positive integer), $C_xH_yF_z$ (wherein x and y are each 0 or a positive integer but not simultaneously 0, and z is a positive integer) or $C_xH_yB_z$ (wherein x and y are each 0 or a positive integer but not simultaneously 0, and z is a positive integer) is added to the film forming-gas.

4. A semiconductor device manufacturing method according to claim 1, wherein wirings or electrodes consisting mainly of a copper film are formed on the substrate.

5. A semiconductor device manufacturing method comprising the steps of:
generating a film-forming gas of (1) one of a silicon-containing organic compound having a siloxane bond and a silicon-containing organic compound having $CH_3$ group and (2) $H_2O$;
setting a flow rate ratio of $H_2O$ to the silicon-containing organic compound to 4 or more; and
adjusting pressure of the film-forming gas to 1.5 Torr or more;
applying power to the film-forming gas to generate a plasma thereof so as to react it, and thus forming a low-dielectric insulating film on a substrate;
annealing the low-dielectric insulating film in an atmosphere of a nitrogen gas or an inert gas at a temperature of 400° C. or more; and then
removing a surface layer of the low-dielectric insulating film.

6. A semiconductor device manufacturing method according to claim 5, wherein the step of removing the surface layer of the low-dielectric insulating film is followed, without bringing the low-dielectric insulating film into contact with ambient atmosphere, by the further step of:
heating the low-dielectric insulating film to 375° C. or more at atmospheric pressure or a lower pressure, and then bringing the low-dielectric insulating film into contact with a process gas having a $CH_3$ group.

7. A semiconductor device manufacturing method according to claim 5, wherein $C_xH_y$ (wherein x and y are each a positive integer), $C_xH_yF_z$ (wherein x and y are each 0 or a positive integer, but not simultaneously 0, and z is a positive integer) or $C_xH_yB_z$ (wherein x and y are each 0 or a positive integer, but not simultaneously 0, and z is a positive integer) is added to the film forming-gas.

8. A semiconductor device manufacturing method according to claim 5, wherein wiring electrodes consisting mainly of a copper film are formed on the substrate.

9. A semiconductor device manufacturing method comprising the steps of:
generating a film-forming gas at a pressure below 1.0 Torr, said film-forming gas containing (1) one of a silicon-containing organic compound having a siloxane bond and a silicon-containing organic compound having a $CH_3$ group and (2) $H_2O$; and
setting a flow rate ratio of $H_2O$ to the silicon-containing organic compound to 12 or more;
heating a substrate to 200° C. or more but no higher than 400° C.; and
applying power of a frequency below 1 MHz to the substrate to bias the substrate and to generate a plasma of the film-forming gas so as to react it, and thus forming a barrier insulating film on the heated substrate.

10. A semiconductor device manufacturing method according to claim 9, wherein, in the step of forming the barrier insulating film, power of a frequency of 1 MHz or more is applied to the film-forming gas to generate a plasma thereof so as to react it, and thus the barrier insulating film is formed.

11. A semiconductor device manufacturing method according to claim 9, wherein dinitrogen monoxide ($N_2O$) is added, or nitrogen ($N_2$) or ammonia ($NH_3$) is added, or dinitrogen monoxide ($N_2O$) and ammonia ($NH_3$) are added to the film-forming gas.

12. A semiconductor device manufacturing method according to claim 9, wherein $C_xH_y$ (wherein x and y are each a positive integer), $C_xH_yF_z$ (wherein x and y are each 0 or a positive integer, but not simultaneously 0, and z is a positive integer) or $C_xH_yB_z$ (wherein x and y are each 0 or a positive integer, but not simultaneously 0, and z is a positive integer) is added to the film forming-gas.

13. A semiconductor device manufacturing method according to claim 9, wherein wirings or electrodes consisting mainly of a copper film are formed on the substrate.

14. A semiconductor device manufacturing method comprising the steps of:
   generating a film-forming gas of (1) one of a silicon-containing organic compound having a siloxane bond and a silicon-containing organic compound having $CH_3$ group and (2) $H_2O$;
   setting flow rate ratio of $H_2O$ to the silicon-containing organic compound to 12 or more;
   adjusting pressure of the film-forming gas to below 1.0 Torr;
   heating a substrate to 200° C. or more but no higher than 400° C.;
   applying power of a frequency of below 1 MHz to the substrate to bias the substrate and to generate a plasma of the film-forming gas by the power of the frequency of below 1 MHz so as to react the plasma, and thus forming a first insulating film;
   again generating said film-forming gas;
   adjusting pressure of the film-forming gas to 1.0 Torr or more;
   heating a substrate to 200° C. or more but no higher than 400° C.; and
   applying power of a frequency of below 1 MHz to the substrate to bias the substrate while applying power at a frequency of 1 MHz or more to the film-forming gas, at a pressure of 1.0 Torr or more, to generate a plasma thereof so as to react it, and thus forming a second insulating film on the first insulating film, whereby a barrier insulating film composed of the first insulating film and the second insulating film is formed.

15. A semiconductor device manufacturing method according to claim 14, wherein dinitrogen monoxide ($N_2O$) is added, or nitrogen ($N_2$) or ammonia ($NH_3$) is added, or dinitrogen monoxide ($N_2O$) and ammonia ($NH_3$) are added to the film-forming gas.

16. A semiconductor device manufacturing method according to claim 14, wherein $C_xH_y$ (wherein x and y are each a positive integer), $C_xH_yF_z$ (wherein x and y are each 0 or a positive integer but not simultaneously 0, and z is a positive integer) or $C_xH_yB_z$ (wherein x and y are each 0 or a positive integer, but not simultaneously 0, and z is a positive integer) is added to the film forming-gas.

17. A semiconductor device manufacturing method according to claim 14, wherein wirings or electrodes consisting mainly of a copper film are formed on the substrate.

* * * * *